US009045844B2

(12) United States Patent
Iwai et al.

(10) Patent No.: US 9,045,844 B2
(45) Date of Patent: Jun. 2, 2015

(54) METHOD FOR PEELING GROUP 13 ELEMENT NITRIDE FILM

(71) Applicant: NGK INSULATORS, LTD., Aichi-prefecture (JP)

(72) Inventors: Makoto Iwai, Kasugai (JP); Takayuki Hirao, Nagoya (JP); Takashi Yoshino, Ama (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 14/167,567

(22) Filed: Jan. 29, 2014

(65) Prior Publication Data

US 2014/0147953 A1 May 29, 2014

Related U.S. Application Data

(63) Continuation of application No. PCT/JP2012/068534, filed on Jul. 13, 2012.

(30) Foreign Application Priority Data

Aug. 10, 2011 (JP) ................................ 2011-175217
Mar. 21, 2012 (JP) ................................ 2012-063322

(51) Int. Cl.
*H01L 21/00* (2006.01)
*C30B 9/10* (2006.01)
(Continued)

(52) U.S. Cl.
CPC ................. *C30B 9/10* (2013.01); *H01L 33/007* (2013.01); *H01L 33/0079* (2013.01); *C30B 29/403* (2013.01); *C30B 33/06* (2013.01); *H01L 33/0075* (2013.01)

(58) Field of Classification Search
None
See application file for complete search history.

(56) References Cited

U.S. PATENT DOCUMENTS 6,864,158 B2 3/2005 Ishida
7,227,172 B2 6/2007 Kitaoka et al.
(Continued)

FOREIGN PATENT DOCUMENTS

JP 2002-217116 A 8/2002
JP 2002-293699 A 10/2002
(Continued)

OTHER PUBLICATIONS

International Search Report for PCT Patent App. No. PCT/JP2012/068534 (Oct. 23, 2012).
(Continued)

*Primary Examiner* — Scott B Geyer
(74) *Attorney, Agent, or Firm* — Cermak Nakajima & McGowan LLP; Tomoko Nakajima

(57) ABSTRACT

A film 3 of a nitride of a group 13 element is grown on a seed crystal substrate 11 by flux process from a melt containing a flux and the group 13 element under nitrogen containing atmosphere. The film 3 of the nitride of the group 13 element includes an inclusion distributed layer **3*a* in a region distant from an interface 11*a* of the film 3 of the nitride of the group 13 element on the side of the seed crystal substrate 11 and containing inclusions derived from components of the melt, and an inclusion depleted layer 3*b*, with the inclusion depleted. provided on the layer 3*a*. Laser light A is irradiated from the side of the back face 1*b* of the seed crystal substrate 11 to peel the single crystal 3 of the nitride of the group 13 element from the seed crystal substrate 11** by laser lift-off method.

8 Claims, 26 Drawing Sheets

(51) Int. Cl.

| | |
|---|---|
| ***C30B 29/40*** | (2006.01) |
| ***C30B 33/06*** | (2006.01) |
| *H01L 33/00* | (2010.01) |

(56) References Cited

U.S. PATENT DOCUMENTS

| | | | | |
|---|---|---|---|---|
| 7,833,346 | B2 * | 11/2010 | Imaeda et al. | 117/64 |
| 7,905,958 | B2 | 3/2011 | Sasaki et al. | |
| 8,227,324 | B2 * | 7/2012 | Yamazaki et al. | 438/479 |
| 8,344,402 | B2 | 1/2013 | Niki et al. | |
| 8,344,403 | B2 | 1/2013 | Niki et al. | |
| 8,404,045 | B2 * | 3/2013 | Kuraoka et al. | 117/90 |
| 2002/0182889 | A1 | 12/2002 | Solomon et al. | |
| 2004/0137662 | A1 * | 7/2004 | Yanagisawa et al. | 438/107 |
| 2004/0219762 | A1 | 11/2004 | Shimoda et al. | |
| 2004/0262630 | A1 | 12/2004 | Kitaoka et al. | |
| 2005/0048686 | A1 | 3/2005 | Kitaoka et al. | |
| 2007/0215035 | A1 | 9/2007 | Kitaoka et al. | |
| 2009/0290610 | A1 | 11/2009 | Eichler et al. | |
| 2010/0213576 | A1 | 8/2010 | Hiranaka et al. | |
| 2011/0011333 | A1 * | 1/2011 | Imaeda et al. | 117/208 |
| 2011/0156212 | A1 | 6/2011 | Arena | |
| 2011/0274609 | A1 | 11/2011 | Shimodaira et al. | |
| 2012/0012984 | A1 | 1/2012 | Shimodaira et al. | |
| 2014/0158978 | A1 | 6/2014 | Iwai et al. | |
| 2014/0197420 | A1 | 7/2014 | Iwai et al. | |

FOREIGN PATENT DOCUMENTS

| | | | |
|---|---|---|---|
| JP | 2004-224600 | A | 8/2004 |
| JP | 2005-247615 | A | 9/2005 |
| JP | 2005-263622 | A | 9/2005 |
| JP | 2005-306709 | A | 11/2005 |
| JP | 2006-008416 | A | 1/2006 |
| JP | 2006-036622 | A | 2/2006 |
| JP | 2006-080497 | A | 3/2006 |
| JP | 2006-332714 | A | 12/2006 |
| JP | 2007-149988 | A | 6/2007 |
| JP | 2009-507364 | A | 2/2009 |
| JP | 2010-052967 | A | 3/2010 |
| JP | 2010-168236 | A | 8/2010 |
| JP | 2011-105586 | A | 6/2011 |
| JP | 2011-207677 | A | 10/2011 |
| WO | WO2005/111278 | A1 | 11/2005 |
| WO | WO2009/047894 | A1 | 4/2009 |
| WO | WO2010/024987 | A1 | 3/2010 |
| WO | WO2010/084675 | A1 | 7/2010 |
| WO | WO2010/092736 | A1 | 8/2010 |

OTHER PUBLICATIONS

Written Opinion for PCT Patent App. No. PCT/JP2012/068534 (Oct. 23, 2012).

Office Action for U.S. Appl. No. 14/167,667 (Jul. 31, 2014).

Office Action for U.S. Appl. No. 14/175,352 (Nov. 6, 2014).

Office Action for Japanese Patent App. No. 2013-528093 (Nov. 26, 2014).

Supplementary European Search Report for European Patent App. No. 12821939.1 (Oct. 31, 2014).

* cited by examiner (a)

(b)

(a)

(b)

(a)

(b)

METHOD FOR PEELING GROUP 13 ELEMENT NITRIDE FILM

FIELD OF THE INVENTION

The present invention relates to a method of peeling a film of a nitride of group 13 element from a seed crystal substrate. The film of nitride of group 13 element and its layered body can be used for a white LED with improved color rendering index, a blue-violet laser disk for high-speed and high-density optical memory, a power device for an inverter for a hybrid car or the like.

BACKGROUND ARTS

It has been recently and intensively studied that a nitride of a group 13 element such as gallium nitride is used to produce a semiconductor device such as a blue ray laser, white ray laser, blue-violet ray semiconductor laser and the like and that the device is applied to various kinds of electronic appliances. Such prior gallium nitride-based semiconductor device has been mainly produced by vapor phase process. Specifically, it has been produced by growing a thin film of gallium nitride by hetero epitaxial growth on a sapphire or silicon carbide substrate by organic metal vapor phase deposition (MOCVD) or the like. In this case, the substrate and thin film of gallium nitride are different from each other in thermal expansion coefficient and lattice constant, so that dislocation (a kind of lattice defect of crystal) is generated in high density in the grown gallium nitride. It has been thus difficult to obtain gallium nitride of a low dislocation density and high quality according to the vapor phase process.

Thus, according to Japanese patent Publication No. 2002-217116A, an under layer of GaN single crystal or the like is formed on a seed crystal substrate by vapor phase process, and an over layer of GaN or the like is then formed again on the under layer. It is generated a region of void or indium precipitation along an interface of the under and over layers so that it is tried to reduce threading dislocation from the under layer to the over layer.

On the other hand, it has been developed liquid phase process in addition to the vapor phase process. So called flux method is one of the liquid phase processes. In the case of gallium nitride, sodium metal is used as a flux so that it is possible to lower temperature required for crystal growth of gallium nitride to around 800° C. and pressure to several MPa. Specifically, nitrogen gas is dissolved into mixed melt of the sodium metal and gallium metal so that gallium nitride is crystallized and grown in the melt in the supersaturating state. According to such kind of liquid phase process, the dislocation can be reduced compared with the vapor phase process, so that it is possible to obtain gallium nitride having a low dislocation density and high quality.

Such flux process has been also extensively researched and developed. For example, according to Japanese Patent Publication No. 2005-263622A, the speed of crystal growth of gallium nitride in the direction of thickness (direction of C-axis) is as low as about 10 μm/h and ununiformed nucleation tends to occur along liquid-vapor interface of the melt in prior flux method. It is thus disclosed a method of producing gallium nitride for overcoming such problems.

The applicant filed Japanese Patent Publication No. 2010-168236A and described the correlation between power of agitation and generation of inclusion. According to the Patent document, it was disclosed to control the growth rate in a preferred range and to adjust the speed and inversion condition of rotation of a crucible, for growing a crystal free of the inclusions.

Further, according to Japanese Patent Publication No. 2006-332714A, it is described a semiconductor light emitting device including a single crystal substrate such as sapphire, and at least two semiconductor layers and a light emitting region provided on a surface of the substrate to provide a laminated film structure. The light emitting region emits light, which is then drawn out through the upper semiconductor layer or the under single crystal substrate. According to such light emitting device, it is demanded to reduce dislocations of the single crystal substrate as well as to reduce the defect density so that its inner quantum efficiency is improved.

Further, according to Japanese Patent Publication Nos. 2002-293699A and 2007-149988A, it is known a laser lift-off technique that a layer of GaN series compound crystal formed on a sapphire body is peeled off by irradiating laser light from the back face of the sapphire body.

SUMMARY OF THE INVENTION

The inventors have studied, in a nitride single crystal produced by flux process on a seed crystal, a method for preventing inclusions therein and further improving quality of the nitride single crystal, as disclosed in Japanese Patent Publication No. 2010-168236A. On the viewpoint of the quality of the nitride single crystal, it is very important to further reduce the defect density on the viewpoint of improving the luminous efficiency or the like. However, there has been a technical limit on this viewpoint and the breakthrough has thus been demanded.

Further, according to Japanese Patent Publication No. 2002-293699A, a gallium nitride single crystal film is formed on a substrate by hydride vapor phase epitaxy (HVPE) process using gallium chloride (GaCl) and ammonia (NH3), and laser is irradiated so that the gallium nitride single crystal film is peeled off from the substrate. Further, although a gallium nitride film is formed according to Japanese Patent Publication No. 2007-149988A, the film-forming method is vapor phase epitaxy process as Japanese Patent Publication No. 2002-293699A. Specifically, it includes metal organic chemical vapor phase epitaxy (MOCVD; MOVPE process), molecular beam epitaxy (MBE) process and hydride vapor phase epitaxy process (HVPE). Therefore, it is not disclosed the technique of peeling a gallium nitride single crystal film grown on a substrate by flux method by means of laser lift-off method without causing cracks.

An object of the present invention is, in a single film of a nitride of a group 13 element formed on a seed crystal substrate by flux method, to further reduce surface defect density of the nitride film and to peel it from the substrate by laser lift-off process without causing cracks.

The present invention provides a method of peeling a film of a nitride of a group 13 element by laser lift-off method, said method comprising the step of:

irradiating a laser light to a layered body comprising a seed crystal substrate and a film of a nitride of a group 13 element grown on the seed crystal substrate by flux method from a melt comprising a flux and a group 13 element under nitrogen containing atmosphere, said laser light being irradiated from a side of a back face of the seed crystal substrate. The film includes an inclusion distributed layer in a region distant by 50 μm or less from an interface of the film of a nitride of group 13 element on the side of the seed crystal substrate and including inclusions derived from components of the melt, and an inclusion depleted layer with the inclusion depleted formed on the inclusion distributed layer.

In the study of forming a nitride single crystal on a seed crystal substrate by flux method, the inventors tried not to simply reduce the inclusions but to leave an appropriate amount of inclusions in a region near the interface of the nitride single crystal and seed crystal. It is proved that the defect density of the nitride single crystal can be further reduced compared with that in the case of the nitride single crystal with very few inclusions.

That is, by growing a nitride single crystal including inclusions with a size of several microns or so only in a region having a thickness of 50 microns during an initial stage of the crystal growth by flux method, it is possible to considerably reduce the dislocation of the crystal and thereby to provide preferable properties for various devices. Such discovery is made contrary to common knowledge of skilled artisans in the art of growing nitride single crystals by flux method.

In addition to this, it was found that the thus obtained single crystal of a nitride of a group 13 element can be peeled off from the underlying seed crystal substrate without cracks by means of laser lift-off method, and the present invention was thus made. Although the reason is not clear, it would be speculated that the peeling from the substrate is facilitated because of the presence of the inclusion distributed layer adjacent to the seed crystal.

EMBODIMENTS FOR CARRYING OUT THE INVENTION (Seed Crystal Substrate)

Figure 1:
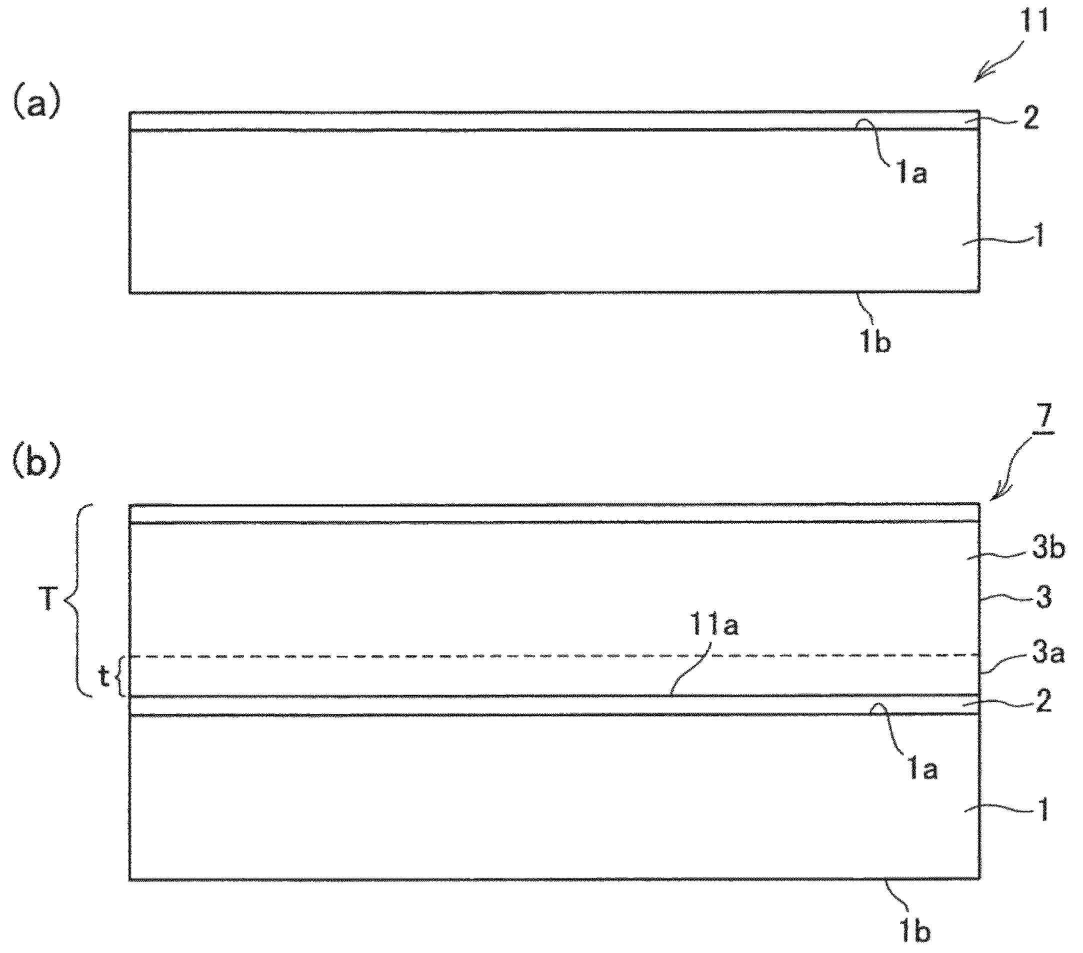
FIG. 1(*a*) is a cross sectional view schematically showing a seed crystal substrate 11, and FIG. 1(*b*) is a cross sectional view schematically showing a nitride single crystal 3 formed on the seed crystal substrate 2 by flux method.

First, FIG. 1(*a*) shows a seed crystal substrate 11. A seed crystal film 2 is formed on an upper face 1*a* of a single crystal substrate 1. 1*b* represents a back face. A buffer layer may be provided between the substrate 11 and seed crystal film 2. Further, the seed crystal substrate may be a thin plate composed of a seed crystal.

Although materials of the single crystal substrate for the seed crystal substrate is not limited, it includes sapphire, AlN template, GaN template, self-standing GaN substrate, silicon single crystal, SiC single crystal, MgO single crystal, spinel ($MgAl_2O_4$), $LiAlO_2$, $LiGaO_2$, and perovskite composite oxide such as $LaAlO_3$, $LaGaO_3$ or $NdGaO_3$ and SCAM ($ScAlMgO_4$). A cubic perovskite composite oxide represented by the composition formula $[A_{1-y}(Sr_{1-x}Ba_x)_y][(Al_{1-z}Ga_z)_{1-u}.Du]O_3$ (wherein A is a rare earth element; D is one or more elements selected from the group consisting of niobium and tantalum; y=0.3 to 0.98; x=0 to 1; z=0 to 1; u=0.15 to 0.49; and x+z=0.1 to 2) is also usable.

A material forming the seed crystal film may preferably be a nitride of a group 13 element, including boron nitride (BN), aluminum nitride (AlN), gallium nitride (GaN), indium nitride (InN), thallium nitride (TlN) and the mixed crystals thereof (AlGaN, AlGaInN or the like).

Further, in the case that the single crystal substrate is composed of a plate of a nitride of a group 13 element, the material includes boron nitride (BN), aluminum nitride (AlN), gallium nitride (GaN), indium nitride (InN), thallium nitride (TlN) and the mixed crystals thereof (AlGaN, AlGaInN or the like).

The buffer layer and seed crystal film may preferably be formed by vapor phase process, including metal organic chemical vapor deposition (MOCVD), hydride vapor phase epitaxy (HVPE), pulse excited deposition (PXD), MBE and sublimation processes. Metal organic chemical vapor deposition process is particularly preferable.

"Single crystal" referred to in the present specification is defined as follows. Although "single crystal includes typical single crystals where atoms are regularly arranged throughout the whole of the crystal, "single crystal" is not limited to such typical ones and includes those generally referred to in the Industries. That is, "single crystal" may include a some degree of defects, or may include internal stress, or may contain impurities in the crystal structure, and includes any single crystal which is distinguishable from polycrystals (ceramics).

(Characteristics of Nitride Film)

Next, as shown in FIG. 1(*b*), a nitride film 3 is formed on the seed crystal substrate by flux process. Here, according to the present invention, an inclusion distributed layer 3*a* is formed within a region distant from 50 μm or smaller from an interface of the seed crystal substrate and the nitride film, and an inclusion depleted layer 3*b* is formed thereon. Besides, "T" represents a thickness of the nitride film 3, and "t" represents a thickness of the inclusion distributed layer which is 50 μm or smaller.

According to the present invention, the inclusion distributed layer 3*a* is provided in a region distant by 50 μm or smaller from the interface 11*a* of the film of nitride of a group 13 element on the side of the seed crystal substrate. 5 represents the inclusions. "Inclusion" referred to herein means a heterogenous phase included in the nitride film and composed of a material derived from components contained in a melt. The components contained in the melt means flux (alkali metals such as sodium), the group 13 element as a raw material of the nitride of the group 13 element and the other additives. Group 13 element means group 13 element according to the Periodic Table determined by IUPAC. The group 13 element is specifically gallium, aluminum, indium, thallium or the like. Further, the additives include carbon, metals of low melting points (tin, bismuth, silver, gold), and metals of high melting points (iron, manganese, titanium, chromium and the other transition metals). The metal of low melting point may be added for preventing oxidation of sodium and metal of high melting point may be contained from a container for containing a crucible, a heater of a growing furnace or the like.

The material forming the inclusion is typically an alloy of the flux and the group 13 element, mixture of the pure metal and alloy, or carbon, or aggregate or polycrystalline material of fine crystals of the nitride of group 13 element.

The inclusion distributed layer and depleted layer are measured as follows.

That is, in the inclusion distributed layer, the inclusions are distributed and can be observed by means of a transmission type optical microscope. Specifically, the distribution of the inclusions can be observed by the optical microscope in a viewing field of height 50 μm from the interface and a width of 100 μm at a magnitude of 200.

In the inclusion distributed layer, the inclusions are basically provided in the direction parallel with the interface. Here, the inclusions may be arranged in the direction parallel with the interface to form an arranged layer, or may be randomly distributed.

Further, the whole of the region distant by 50 μm or smaller from the interface may be made the inclusion distributed layer. Alternatively, a part of the region distant by 50 μm or smaller from the interface may be made the inclusion distributed layer and the reminder may be free from the inclusions. In other words, it is not necessary that the inclusions are distributed over the whole of the region distant by 50 μm or smaller from the interface.

Specifically, the inclusions are observed for each of five layers each having a thickness of 10 μm and arranged from the interface in the direction of the thickness of the film. Then, in each of the five layers, it is observed whether the inclusions are distributed or not. More preferably, a ratio of area of the inclusions in at least one of the layers may preferably be 1 percent or higher and more preferably 2 percent or higher. Although the upper limit is not particularly limited, the crystallinity would tend to be deteriorated as the inclusions are too much. On the viewpoint, the ratio of the area of the inclusions may preferably be 10 percent or lower, more preferably be 7 percent or lower and most preferably be 5 percent or lower.

Further, preferably, in the whole of the region distant by 50 μm or smaller from the interface, the ratio of the area of the inclusions may preferably be 1 percent or higher and more preferably be 2 percent or higher. Although the upper limit is not particularly limited, the crystallinity would tend to be deteriorated as the inclusions are too much. On the viewpoint, the ratio of the area of the inclusions may preferably be 10 percent or lower, more preferably be 7 percent or lower and most preferably be 5 percent or lower.

Here, the ratio of the area of the inclusions in the inclusion distributed layer is calculated as follows. That is, as shown in FIG. 2 and FIGS. 6 to 13, the seed crystal and nitride film thereon are cut out along the cross section, and the cross section is polished using diamond slurry of grain size of about 1 μm. An image of the cross section is then taken by a transmission type optical microscope at a magnitude of 200 and the thus obtained image is subjected to binarization. The binarization is performed by "Image pro plus" supplied by Media Cybernetics corporation in the U.S.

Here, it is specifically described a method of the binarization. First, the image taken by a transmission type optical microscope is stored in a personal computer in non-compressed format (TIFF format). A compressed format (jpeg) is not preferred since the image is deteriorated. Further, it is preferred that the image is stored at a high pixel number of 1M pixel or higher. The image is then converted based on 8 bit gray scale. That is, each pixel of the image is categorized into gradations of 0 to 255. The gradation of the peak intensity is read out by an intensity distribution function of a software ("display range" is selected in the above software). This is labeled as "$X_{peak}$". Further, it is read out a value of the gradation distributed at 99.9 percent from the upper end of the gradation distribution. This value is labeled as "$X_{99.9}$". It is then decided a threshold value for the binarization. The gradations are divided into two categories such that white is assigned for the gradations below the threshold value and black is assigned for those above the threshold value. The threshold value is calculated based on $X_{peak}\times2-X_{99.9}$. The black parts in the binarized image correspond with the inclusions. Then, for a region to be targeted, the area of the inclusions is divided by total area of the inclusion distributed layer to obtain the ratio of area in the inclusion distributed layer.

Figure 2:
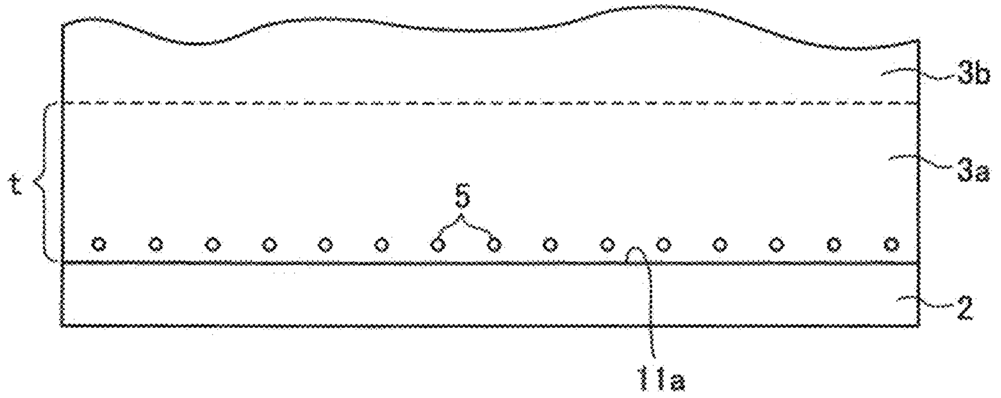
FIGS. 2(*a*) and 2(*b*) are diagrams schematically showing a region of the nitride single crystal 3 near the seed crystal film.
Figure 2:
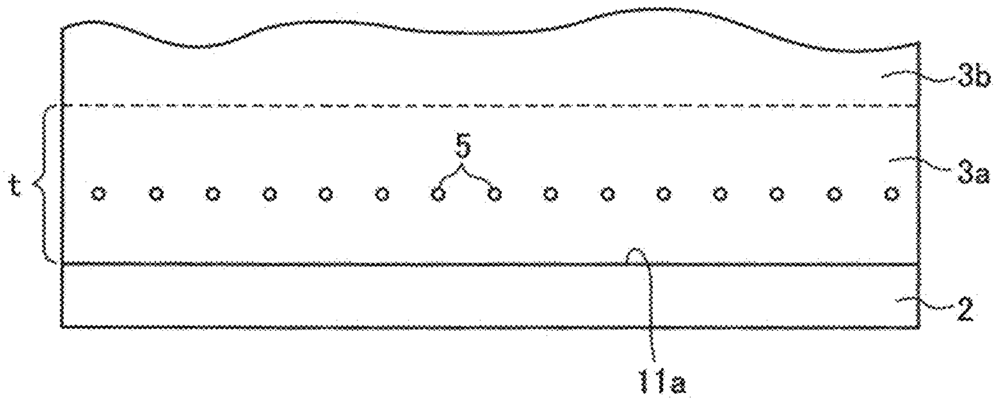

For example, according to an example of FIG. 2(*a*), inclusions 5 are arranged in the vicinity of the interface 11*a*. According to an example of FIG. 2(*b*), the inclusions 5 are arranged in a layer distant from the interface 11*a*. In both cases, for each of the layers each having a thickness of 10 μm arranged from the interface, the area is assigned as a denominator and the area of the inclusions contained in the layer is assigned as a numerator.

The inclusion depleted layer means that the distribution of the inclusions are not observed, provided that it is observed by an optical micrograph at a magnitude of 200 for a viewing area of a height of 50 μm×width of 100 μm. However, it is permitted that, in the inclusion depleted layer, a small amount of inclusions may be inevitably precipitated. Specifically, the ratio of the area of the inclusions may preferably be lower than 1 percent and more preferably be 0.5 percent or lower, and most preferably the inclusions are not substantially observed. Further, preferably, a region from the surface of the film to the position distant from the interface by 50 μm is occupied by the inclusion depleted layer.

Further, in the inclusion distributed layer, the area of each of the inclusions is preferably small, more preferably 60 $\mu m^2$ or smaller and most preferably be 20 $\mu m^2$ or smaller. However, it is permitted that an inclusion having an area larger than 60 $\mu m^2$ is precipitated due to deviation of the production. Even in such case, a number of the inclusions whose area exceed 60 $\mu m^2$ is preferably 2 or smaller and most preferably 1 or smaller, in a field of observation of 50 μm×100 μm.

Although the thickness "T" of the film of nitride of group 13 element is not limited, the thickness may preferably be 50 μm or larger, and more preferably be 100 μm or larger. Although the upper limit of "T" is not particularly defined, "T" may be made 5 mm or smaller on the viewpoint of the production.

(Processing of the Inventive Nitride Film)

Figure 3:
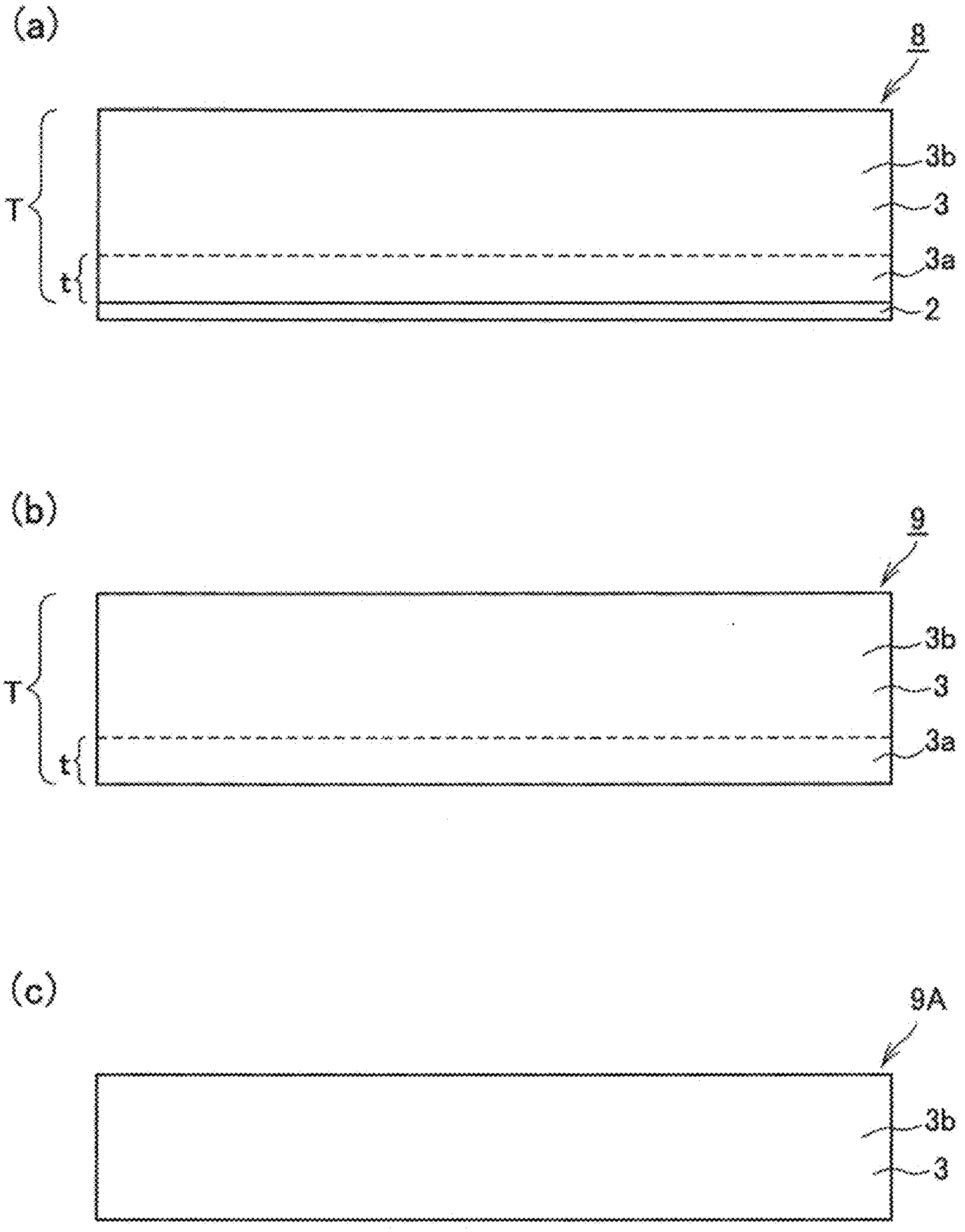
FIG. 3(*a*) is a diagram schematically showing a layered body, FIG. 3(*b*) is a diagram schematically showing a film 3 of a nitride of a group 13 element, and FIG. 3(*c*) is a diagram schematically showing a base material 9A obtained by removing an inclusion distributed layer.

According to the present invention, the single crystal of a nitride of a group 13 element is peeled from the seed crystal substrate by laser lift-off method. For example, as a layered body 8 shown in FIG. 3(*a*), the single crystal substrate 1 is peeled. Alternatively, as shown in FIG. 3(*b*), the single crystal film 2 is further removed to leave the single crystal of a nitride of group 13 element only, which may be utilized as a base material 9 for a device. Further, as shown in FIG. 3(*c*), the inclusion distributed layer 3*a* is removed from the nitride film 3 to provide a device base material 9A composed of the inclusion depleted layer only.

According to the present invention, the film of the nitride of the group 13 element is peeled from the substrate by laser lift-off method. In this case, in the case that the warping of the film is small, it is easier to adjust the focal point of the laser onto the interface. Further, in the case that the seed crystal substrate and film are polished to provide a wafer which is then adhered onto a supporting substrate and that laser light is irradiated from the substrate side, as the warping of the film of the nitride of the group 13 element is small, it is easier to adhere the wafer onto the supporting substrate. Further, in the case that a functional layer is formed on the film of the nitride of the group 13 element by vapor phase epitaxy process, the quality of the functional layer is improved.

Here, it is effective to reduce the warping of the film by providing the inclusion distributed layer according to the present invention. This effect is most considerable when the thickness of the inclusion depleted layer is 20 to 0.1 provided that the thickness of the inclusion distributed layer is assigned to 1.

That is, when the thickness of the inclusion depleted layer is 20 or lower provided that the thickness of the inclusion distributed layer is assigned to 1, the effect of reducing the warping is considerable. On the viewpoint, the thickness of the inclusion depleted layer may preferably be 10 or lower.

Further, when the thickness of the inclusion depleted layer is 0.1 or more provided that the thickness of the inclusion distributed layer is assigned to 1, the quality of the functional layer formed on the film of nitride of group 13 element can be improved. On the viewpoint, the thickness of the inclusion depleted layer may more preferably be 0.5 or more.

The warping of the inventive film after the growth may preferably be 200 μm or smaller and more preferably be 150 μm or smaller.

(System and Conditions for Production)

Figure 4:
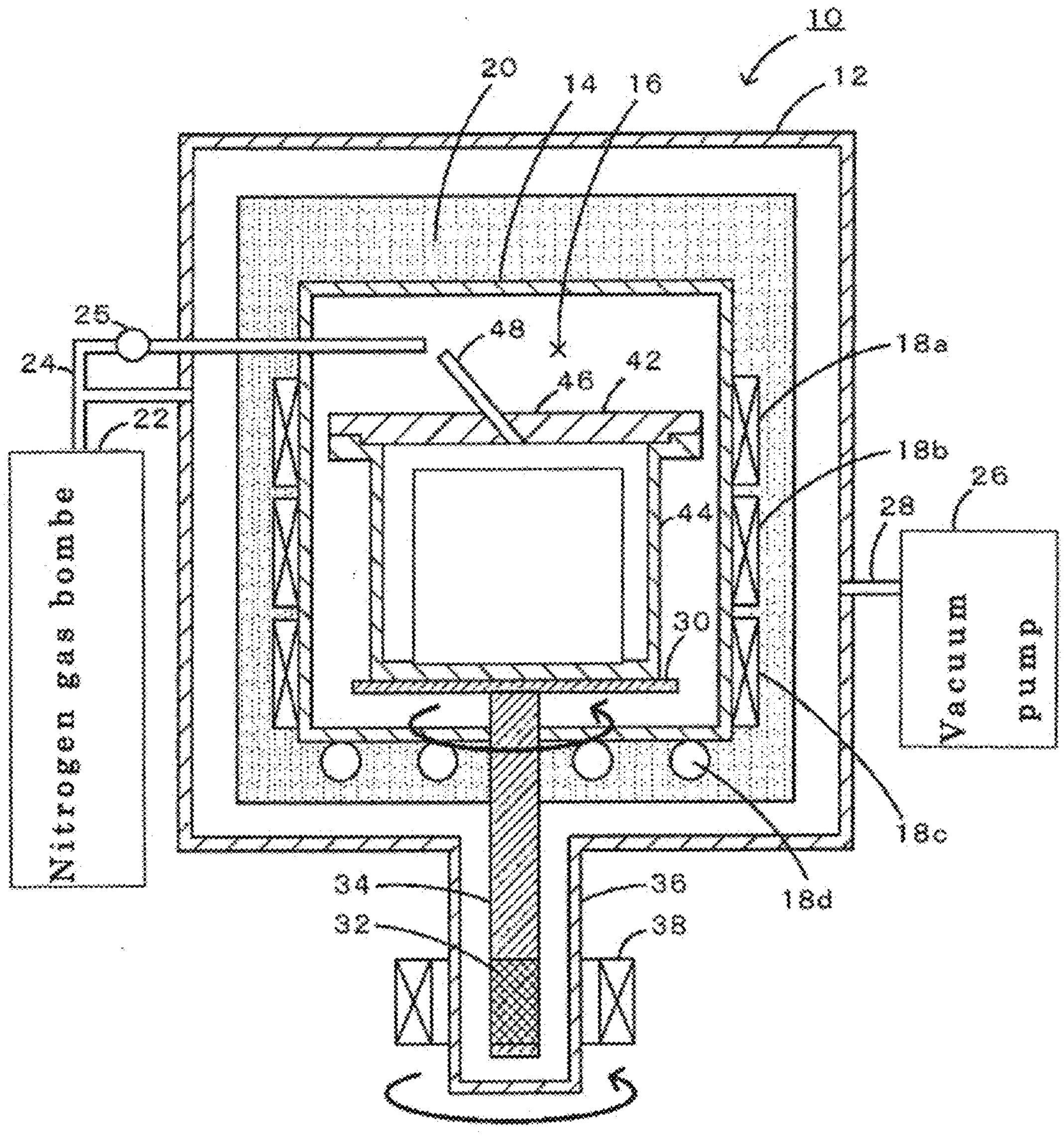
FIG. 4 is a diagram schematically showing a system utilizable for producing the inventive nitride single crystal.
Figure 5:
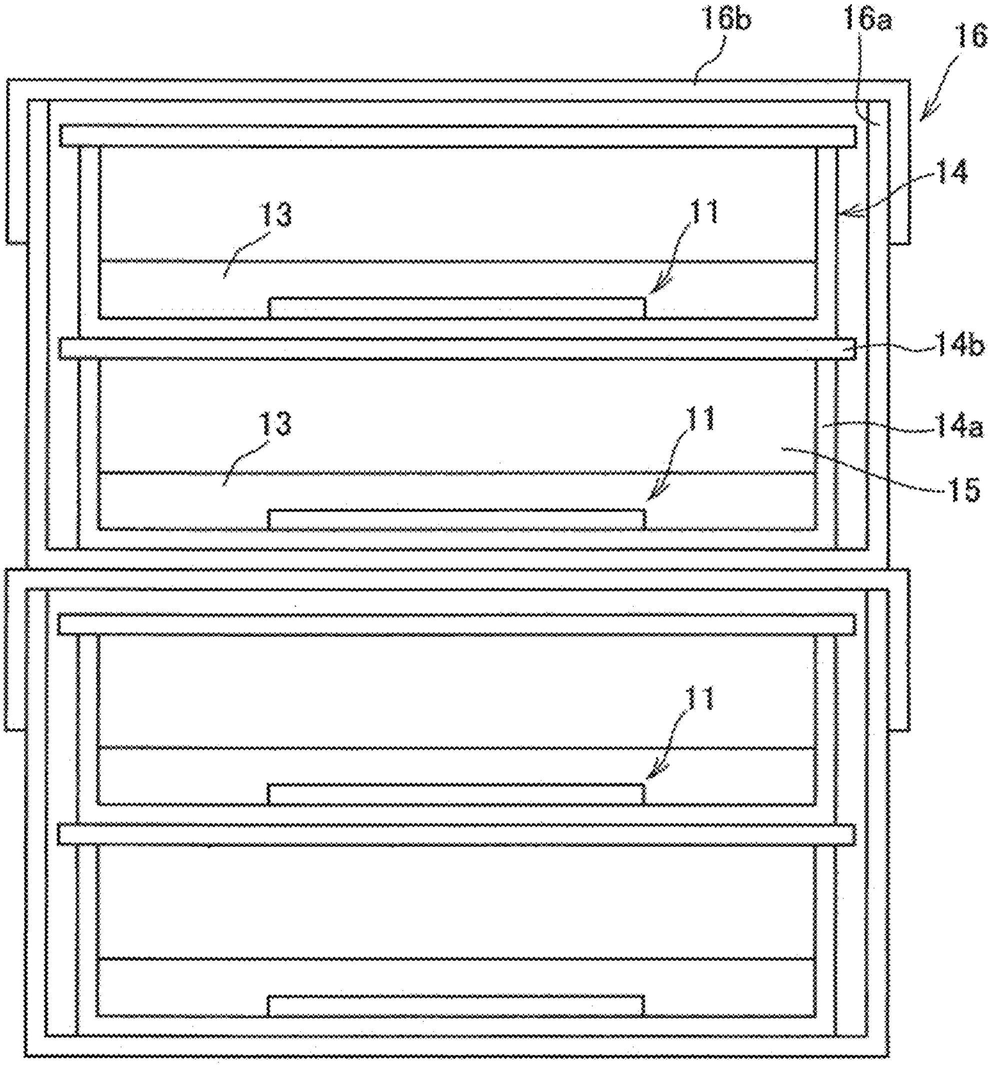
FIG. 5 is a diagram schematically showing a container utilizable for producing the inventive nitride single crystal.

FIGS. 4 and 5 show construction of a system usable for producing the inventive nitride film.

A system 10 for producing a crystal includes a pressure container 12 having functions of vacuum suction and supply of pressurized nitrogen gas, a rotatable table 30 set in the pressure container 12, and an outer container 42 mounted on the rotatable table 30.

The pressure container 12 is formed to a cylindrical shape having upper and lower disks and defines a heating space 16 surrounded by a heater cover 14. A temperature in the heating space 16 can be controlled with an upper heater 18*a*, a medium heater 18*b* and a lower heater 18*c* arranged vertically on a side face of the heater cover 14 as well as a bottom heater 18*d* positioned on a bottom face of the heater cover 14. The insulation property of the heating space 16 is improved by a heat insulator 20 surrounding and covering the heater cover 14. Further, a nitrogen gas pipe 24 from a nitrogen gas bombe 22 and vacuum suction pipe 28 from a vacuum pump 26 are connected to the pressure container 12. The nitrogen gas pipe 24 penetrates through the pressure container 12, heat insulator 20 and heater cover 14 and is opened to the inside of the heating space 16. The nitrogen gas pipe 24 is branched in an intermediate pipe so that the pipe is opened to a space between the pressure container 12 and heat insulator 20. Although the heater cover 14 is not completely sealed, nitrogen gas is supplied to both outside and inside of the heater cover 14 so as to prevent a large difference of pressures in the outside and inside of the heater cover 14. The intermediate branched pipe of the nitrogen gas pipe 24 communicating with the inside of the heating space 16 is equipped with a mass flow controller 25 having a function of adjusting a flow rate. The vacuum suction pipe 28 penetrates through the pressure container 12 and is opened to a space between the pressure container 12 and heat insulator 20. When the outside of the heater cover 14 is made vacuum state, the heating space 16 communicated thereto with the nitrogen gas pipe 24 is also made vacuum state.

The rotatable table 30 is formed into cylindrical shape and positioned in a lower part of the heating space 16. A rotatable shaft 34 with an inner magnet 32 is fitted to a lower face of the rotatable table 30. The rotatable shaft 34 penetrates through the heater cover 14 and heat insulator 20 and is inserted into a cylindrical casing 36 integrated with the lower face of the pressure container 12. A cylindrical outer magnet 38 is positioned on an outer periphery of the casing 36 so that the magnet is rotatable by means of a motor not shown. The outer magnet 38 is opposed to an inner magnet 32 of the rotatable shaft 34 through the casing 36. Consequently, as the outer magnet 38 rotates, the rotatable shaft 34 having the inner magnet 32 is rotated so that the rotatable table 30 is thus rotated. Further, as the outer magnet 38 is vertically moved, the rotatable shaft 34 with the inner magnet 32 is vertically moved so that the rotatable table 30 is vertically moved.

An outer container 42 includes an outer container main body 44 having a shape of a cylinder with a bottom plate and made of a metal, and an outer container lid 46 made of a metal and for closing an upper opening of the main body 44. A nitrogen gas introducing pipe 48 is fitted to the outer container lid 46 from a center of its bottom plane at an inclined angle toward the top. The nitrogen introducing pipe 48 is designed not to collide the nitrogen gas pipe 24, even when the outer container 42 is rotated and approached to the nitrogen gas pipe 24 by the minimum distance as the rotation of the rotatable table 30. Specifically, the minimum distance of the nitrogen introducing pipe 48 and nitrogen pipe 24 is designed to be several millimeters to several tens centimeters. The inner container 16 of FIG. 5 is mounted in the inside of the outer container main body 44.

That is, according to example of FIG. 5, two layers of the inner containers 16 are laminated. Each of the inner containers 16 includes a main body 16*a* and a lid 16*b*. A predetermined number, for example two, crucibles 14 are contained and laminated in an inner space of the container 16. Each of the crucibles 14 includes a main body 14*a* and a lid 14*b*, and materials of a melt 13 are charged into the main body 14*a*.

It will be described an example of use of the thus constituted system 10 of producing a crystal plate according to the present embodiment. The production system 10 is used for producing a nitride of group 3B by flux process. It will be described below the embodiment of producing a plate of gallium nitride as the crystal of nitride of group 3B element. In this case, a GaN template is prepared as the seed crystal substrate 11, gallium metal is prepared as the group 3B metal and sodium metal is prepared as the flux. The seed crystal substrate 11 is immersed in mixed melt containing the metal gallium and metal sodium in the crucible 14. While the rotatable table 30 is rotated and the heating space 16 is heated by the heaters 18*a* to 18*d*, pressurized nitrogen gas is supplied into the mixed melt so that gallium nitride crystal is grown on the seed crystal substrate in the mixed melt. It is preferred to add an appropriate amount of carbon into the mixed melt to prevent the formation of crystals by spontaneous nucleation. Crystals by spontaneous nucleation means gallium nitride crystallized at positions other than the seed crystal substrate. The thus grown gallium nitride crystal in the mixed melt in the crucible is cooled and then collected, by adding an organic solvent (for example, a lower alcohol such as methanol and ethanol) into the crucible to dissolve unnecessary matters such as the flux in the organic solvent.

In the case that gallium nitride crystal is produced as described above, the heating temperature is set under the boiling point of the mixed melt under the pressurized nitrogen gas containing atmosphere. Specifically, the heating temperature may preferably be set in a range of 700 to 1000° C. and more preferably be set in a range of 800 to 900° C. For making the temperature in the heating space 16 uniform, it is preferred to set the temperatures of the upper heater 18*a*, medium heater 18*b*, lower heater 18*c* and bottom heater 18*d* in the ascending order, or to set the temperatures of the upper heater 18*a* and medium heater 18*b* at the same temperature T1 and, at the same time, to set the temperatures of the lower heater 18*c* and the bottom heater 18*d* at a temperature T2 higher than the temperature T1. Further, the pressure of the pressurized nitrogen gas may preferably be made 1 to 7 MPa and more preferably be made 2 to 6 MPa. For adjusting the pressure of the pressurized nitrogen gas, the vacuum pump 26 is driven to make the inner pressure of the pressure container 12 high vacuum state (for example, 1 Pa or lower, or 0.1 Pa or lower) through the vacuum suction pipe 28. Thereafter, the vacuum suction pipe 28 is closed by means of a valve not shown and nitrogen gas is supplied into both inside and outside of the heater cover 14 through the nitrogen gas pipe 24 from the nitrogen gas bombe 22. During the growth of the gallium nitride crystal, the nitrogen gas is dissolved into the mixed melt and consumed and the pressure of nitrogen gas is lowered, so that nitrogen gas is supplied into the heating space 16 during the crystal growth by the mass flow controller 25 to maintain a predetermined flow rate. During the process, the branched pipe of the nitrogen gas pipe 24 communicating with the outside of the heater cover 14 is closed by a valve not shown.

According to the method of the present invention, it is preferred that the pressure of the pressurized atmosphere is set in a range of 1 to 7 MPa. A production system with lower pressure resistance can be thereby used compared with the case that the pressure is set at several hundreds MPa to realize the miniaturization and weight reduction.

Here, for rotating the container, the rotation direction of the container may be inverted or unidirectional. In the case that the rotation of the container is unidirectional, the rotational speed may be made 10 to 30 rpm, for example. Further, in the case that the rotational direction of the container is inverted, the rotational speed may be made 10 to 30 rpm, for example.

Further, by making the depth of the melt in the crucible 14 small, it is possible to facilitate the inclusion in the crystal in the initial stage. For this, as shown in FIG. 5, it is preferred to use a crucible 14 having a small height and to put the seed crystal substrate 11 horizontally on the bottom of the crucible in the melt. Further, it is preferred to laminate a plurality of the crucibles 14 each having a small height. Similarly, it is possible to facilitate the inclusion in the initial stage, by making an unsaturated time period before the crystal growth shorter. At the same time with these, by adjusting the rotational speed as described above, it is possible to prevent the generation of the inclusion after the initial stage of the growth is over.

Further, the ratio (molar ratio) of the nitride of group 13 element/flux (for example sodium) in the melt may preferably be higher on the viewpoint of the present invention, and preferably be 18 mol percent or higher and more preferably be 25 mol percent or higher. It is possible to facilitate the formation of the inclusions in the initial stage by increasing the molar ratio. However, since the crystal quality tends to be lower as the ratio becomes higher, the ratio may preferably be 40 mol percent or lower.

(Light Emitting Device Structure)

According to the present invention, a predetermined light emitting structure is formed on the film of the nitride of the group 13 element described above. Such light emitting structure itself is known and includes a n-type semiconductor layer, a p-type semiconductor layer and a light emitting region between them.

The film of the nitride of the group 13 element according to the present invention can be used for producing a light emitting device. The light emitting device may have the structure, for example, as schematically shown in FIG. 6.

Figure 6:
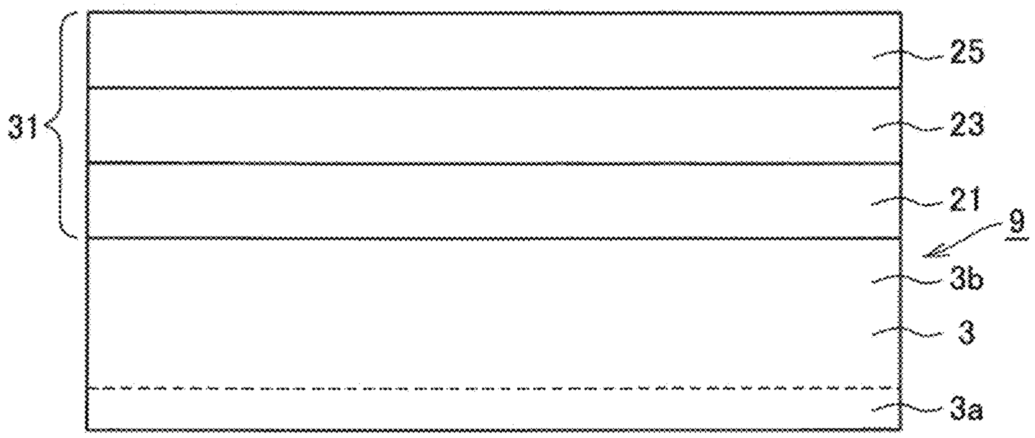
FIG. 6(*a*) is a diagram schematically showing a light emitting device obtained by peeling the seed crystal substrate, and FIG. 6(*b*) is a diagram schematically showing a light emitting device obtained by further removing the inclusion distributed layer 3*a* from the light emitting device of FIG. 6(*a*).
Figure 6:
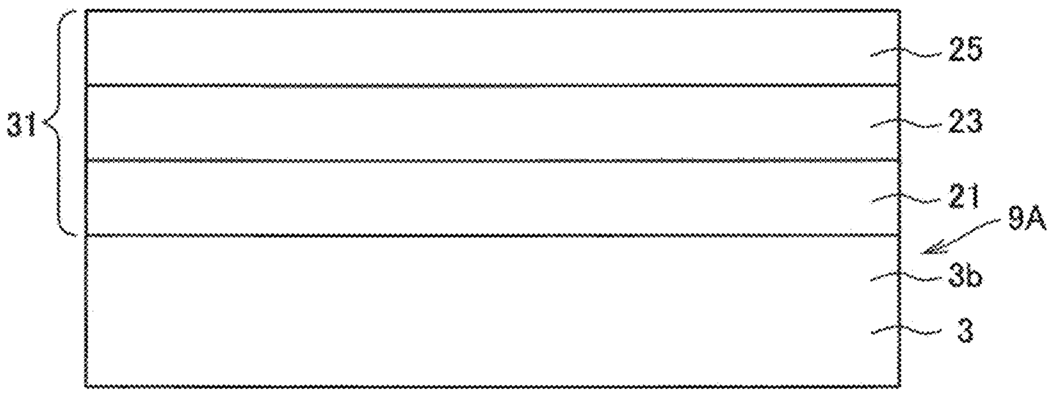

According to the example of FIG. 6(*a*), an n-type semiconductor layer 21, a light emitting region 23 and a p-type semiconductor layer 25 are formed on the single crystal 3 of the nitride of the group 13 element to provide a light emitting structure 31. According to the example of FIG. 6(*b*), the inclusion distributed layer is further removed from the film 3 of the nitride single crystal of a group 13 element, and the n-type semiconductor layer 21, light emitting region 23 and p-type semiconductor layer 25 are formed on the inclusion depleted layer 3*b*.

Further, the light emitting structure described above may preferably further include an electrode for the n-type semiconductor layer, an electrode for the p-type semiconductor layer, a conductive adhesive layer, a buffer layer and a conductive supporting body or the like not shown.

According to the light emitting structure, as light is emitted in the light emitting region through re-combination of holes and electrons injected the semiconductor layers, the light is extracted through the side of a translucent electrode on the p-type semiconductor layer or the film of the nitride of the group 13 element. Besides, the translucent electrode means an electrode capable of transmitting light and made of a metal thin film or transparent conductive film formed substantially over the whole surface of the p-type semiconductor layer.

The n-type semiconductor layer or p-type semiconductor layer is composed of a semiconductor of III-V group compound semiconductor, which includes the followings.

$Al_yIn_xGa_{1-x-y}N$ $(0 \le x \le 1, 0 \le y \le 1)$

As a dopant for imparting n-type conductivity, silicon, germanium and oxygen are listed. Further, as a dopant for imparting p-type conductivity, magnesium and zinc are listed.

The surface of the film of the nitride of the group 13 element for providing the light emitting structure may be a flat face. However, as the Patent document 4, it is possible to provide roughness on the surface of the film of a nitride of the group 13 element to change the propagating direction of light in the semiconductor layer and to improve the outer quantum efficiency.

As a material of the electrode, it may be listed an alloy and a multi layered film containing at least one selected from the group consisting of Ni, Pd, Co, Fe, Ti, Cu, Rh, Au, Ru, W, Zr, Mo, Ta, Pt, Ag, the oxides of them and nitrides of them. They may be annealed at a temperature of 400° C. or higher to obtain good ohmic contact with the p-type semiconductor layer. It is particularly preferred a multi layered film of Au on Ni. The total thickness of the electrode may preferably be 50 to 10000 angstroms. Particularly in the case that it is used as a translucent electrode, the total thickness may preferably be 50 to 400 angstroms. Further in the case that it is used as a non-translucent electrode, the total thickness may preferably be 1000 to 5000 angstroms.

A peeling layer may be provided between the n-type semiconductor layer and the film of the nitride of the group 13 element. The material of the peeling layer includes GaN.

The method of growing each of the semiconductor layers constituting the light emitting structure includes various kinds of vapor phase growing methods. For example, metal organic chemical vapor deposition (MOCVD; MOVPE), molecular beam epitaxy (MBE) method, hydride vapor phase epitaxy (HVPE) or the like. Among them, it is possible to obtain them with good crystallinity and high speed by MOCVD method. According to MOCVD method, an alkyl metal compound such as TMG (trimethyl gallium) and TEG (triethyl gallium) or the like is used as the Ga source in many cases and a gas such as ammonia and hydrazine is used as the nitrogen source.

The light emitting region includes a quantum well active layer. The material of the quantum well active layer is designed so that the band gap is made smaller than those of the n-type and p-type semiconductor layers. The quantum well active layer may be a single quantum well active layer (SQW) structure or a multi quantum well active layer (MQW) structure. The material of the quantum well active layer includes the followings. As a preferred example of the quantum well active layer, it is listed an MQW structure including three to five periods of quantum well active layers each made of $Al_xGa_{1-x}N/Al_yGa_{1-y}N$ series with a film thickness of 3 nm/8 nm.

As the conductive adhesive, for example, it may be used an Au/Ge solder in a thickness of about 0.5 to 100 μm. Further, the light emitting structure may be joined with a separate supporting body through the conductive adhesive. The conductive supporting body has the functions of supporting the light emitting structure and injecting current into the p-type semiconductor layer. The material of the conductive supporting body includes GaAs, SiC, Si, Ge, C, Cu Al, Mo, Ti, Ni, W, Ta, Cu, W, Au/Ni or the like.

(Laser Lift-Off Method)

Figure 7:
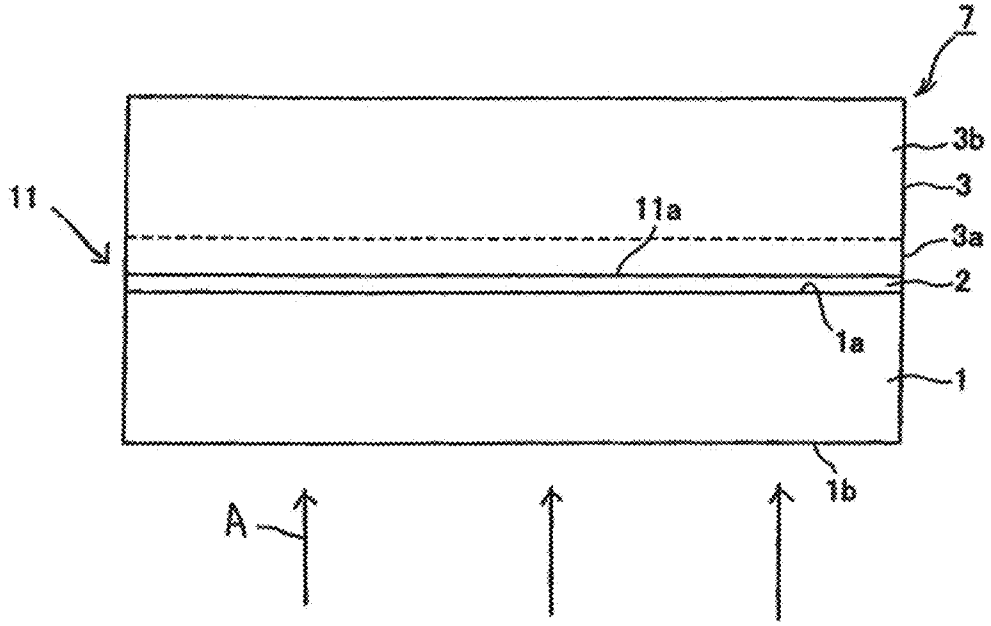
FIG. 7(*a*) is a schematic view showing the state that laser light A is irradiated from the side of a back face 1*b* of a seed crystal substrate 11, and FIG. 7(*b*) is a view schematically showing a film 9 of a nitride of a group 13 element peeled from the substrate by lase lift-off method.
Figure 7:
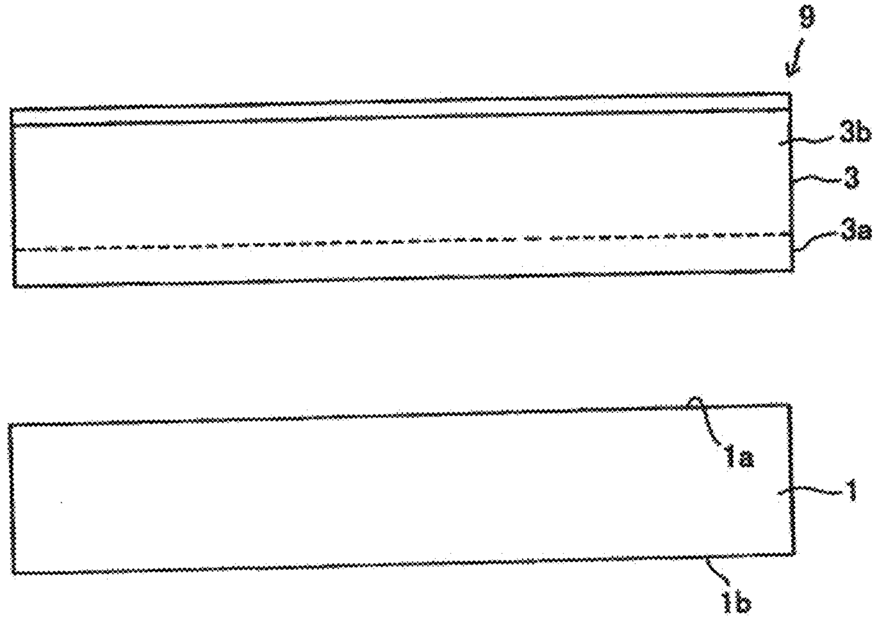

According to the present invention, as shown in FIG. 7(*a*), laser light is irradiated from the side of the back face 1*b* of the seed crystal substrate 11 as an arrow A so that the film 3 of the nitride of the group 13 element is peeled off from the substrate 1 to provide a base material 9 as shown in FIG. 7(*b*). After the base material 9 composed of the film 3 of the nitride of the group 13 element is peeled from the substrate 1, the light emitting structure 31 may be formed as described above.

Figure 8:
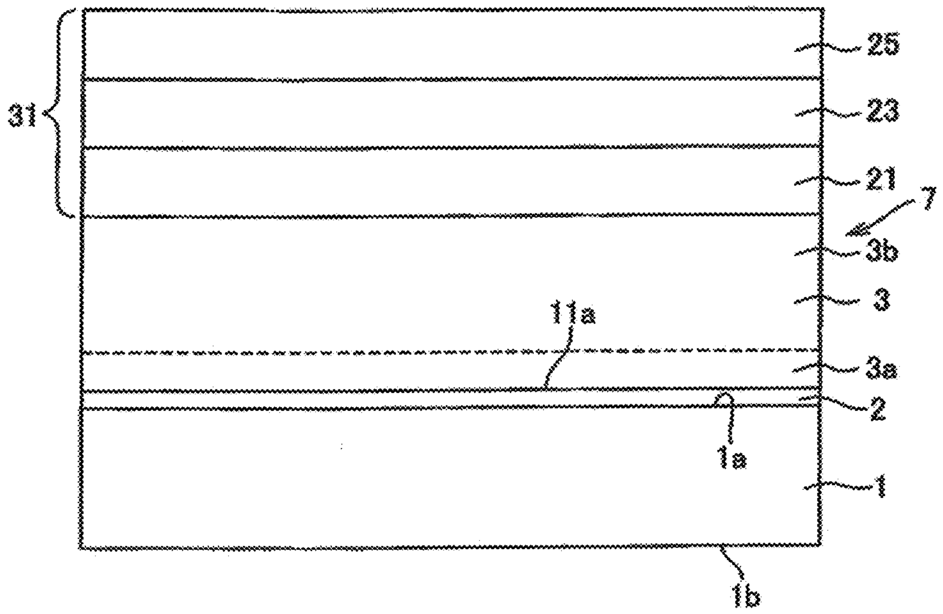
FIG. 8 shows the state that laser light A is irradiated from the side of the back face 1*b* of the substrate to a light emitting device including a single crystal substrate 1, a seed crystal film 2, a film 3 of a nitride of a group 13 element, an n-type semiconductor layer 21, a light emitting region 23 and a p-type semiconductor layer 25.

Alternatively, as shown in FIG. 8, the light emitting structure 31 may be formed on the film 3 of the nitride of the group 13 element without peeling the seed crystal substrate from the film 3 of the nitride of the group 13 element. In this case, after the light emitting structure 31 is formed, laser light is irradiated from the side of the back face 1*b* as an arrow A, so that the seed crystal substrate 11 is peeled off from the light emitting structure by laser lift-off method to obtain a device shown in FIG. 6(*a*). Thereafter, the inclusion distributed layer 3*a* may be removed by polishing or the like as described above.

Any device of oscillating laser may be used as far as it is possible to decompose and peel the crystal layer from the substrate. Such laser oscillating device includes KrF eximer laser, ArF eximer laser, Nd:YAG laser and $YVO_4$ laser. Further, the laser light may be irradiated as pulsed light, and in this case, its frequency may be about 0.1 to 100 kHz (or about 1 to 100 nano seconds as its pulse length).

The wavelength of the laser light may be adjusted depending on the material of the nitride of the group 13 element to be peeled. For example, laser lights having the following wavelengths are preferably used for peeling the following materials.

GaN: 200 to 360 nm

AlN: 150 to 200 nm

GaAlN: 200 to 250 nm

The method of performing the laser lift-off is not particularly limited. For example, laser beam emitted from the laser oscillating device is converted to condensed laser beam through a beam expander, columnar lens or convex lens, dichroic mirror and condensing lens, and the condensed beam is irradiated onto the layered body or light emitting device on an X-Y stage from the side of the back face of the substrate. The columnar lens and condensing lens may be combined so that the focal lengths in the x- and y-directions may be made different from each other and, for example, the laser beam may be strongly focused in the x-direction and defocused into an ellipse shaped laser light beam in the y-direction.

Further, it may be used a laser lift-off system utilizing a beam scanner. That is, laser beam emitted from the laser oscillating device is converted to condensed laser beam through a beam expander, columnar lens and convex lens, reflecting mirror, Galvanometer scanner or fθ lens, and the beam is irradiated onto the layered body or light emitting device on a moving X-Y stage from the side of the back face of the substrate.

When the laser lift-off is performed, as described in Japanese Patent Publication No. 2002-293699A, it is possible to selectively form convex and concave region on a main face of the single crystal substrate. The seed crystal film made of a nitride and the film of the nitride of the group 13 element may be grown on the convex and concave region so that the concaves of the convex and concave region are filled to provide a flat surface over them. A stress in a region irradiated by the laser light is relaxed by the cleavage of the filled region and the other region of the semiconductor layer of the nitride filling the concaves of the substrate, in the direction parallel with the main face of the substrate. Cracks and fractures in the direction perpendicular to the main face of the substrate are thereby prevented.

According to this embodiment, it is preferred to irradiate the laser light at least onto the convex parts of the convex and concave region of the substrate. It is thereby unnecessary to scan the whole surface of the semiconductor layer and to shorten the irradiating time of the laser, so that the productivity can be improved.

Besides, as a method of forming the convex and concave region on the main face of the single crystal substrate, it may be used RIE, ion milling, ECR etching methods or the like. Further, it may be used a physical means such as sand blasting or polishing, or deposition process such as selective growth or the like.

EXAMPLES

Inventive Example 1

The crystal production system shown in FIGS. 4 and 5 was used to produce gallium nitride crystal. The procedure will be described below. First, in a glove box filled with argon atmosphere, it is provided a seed crystal substrate (GaN template of ϕ2 inches:GaN thin film (thickness of 5 microns) is formed on a sapphire substrate by MOCVD process) horizontally on a bottom of the crucible 14 having an inner diameter ϕ of 70 mm.

At this stage, the defect density at the surface of the GaN thin film was evaluated by CL (Cathode Luminescence) and proved to be about $8\times10^8$ to $2\times10^9/cm^2$.

Then, 15 g of sodium metal, 10 g of gallium metal and 39 mg of carbon (Ga/Na ratio was 18 mol %, C/Na ratio was 0.5 mol %) were charged into the crucible 14. The crucible 14 was contained in the inner container 16 made of stainless steel, and the inner container 16 was then contained in the outer container 14. An opening of the outer container main body was closed with the outer container lid equipped with the nitrogen introducing pipe. The outer container was then mounted on the rotatable table which was subjected to vacuum baking in advance, and the pressure container 12 was sealed with a lid.

Then, the inside of the pressure container was suctioned to vacuum with a vacuum pump to a pressure of 0.1 Pa or lower. Then, while the upper heater, medium heater, lower heater and bottom heater were adjusted at temperatures of 860° C., 860° C., 870° C. and 870° C., respectively, so that the temperature in the heating space reached 865° C., nitrogen gas was introduced from a nitrogen gas bombe to a pressure of 4.0 MPa and the outer container was rotated clockwise around a center axis at a rotation speed of 30 rpm. The acceleration time period "a" was 1 second, retention time period "b" was 15 seconds, deceleration time period "c" was 1 second, and stopping time period "d" was 0.5 second. The container was held for 10 hours under these conditions. Thereafter, the container was naturally cooled to room temperature, and the lid of the pressure container was opened to draw the crucible from the inside. Ethanol was then charged into the crucible to dissolve the sodium metal in the ethanol, and the grown gallium nitride crystal plate was collected. The gallium nitride had a size of ϕ2 inches and was grown on the seed crystal substrate by a thickness of about 0.1 mm. Therefore, the average growth rate of the crystal was estimated as about 10 μm/hr.

Besides, the depth of the melt was about 4 mm, and the unsaturated time period was about 2 hours.

Figure 17:
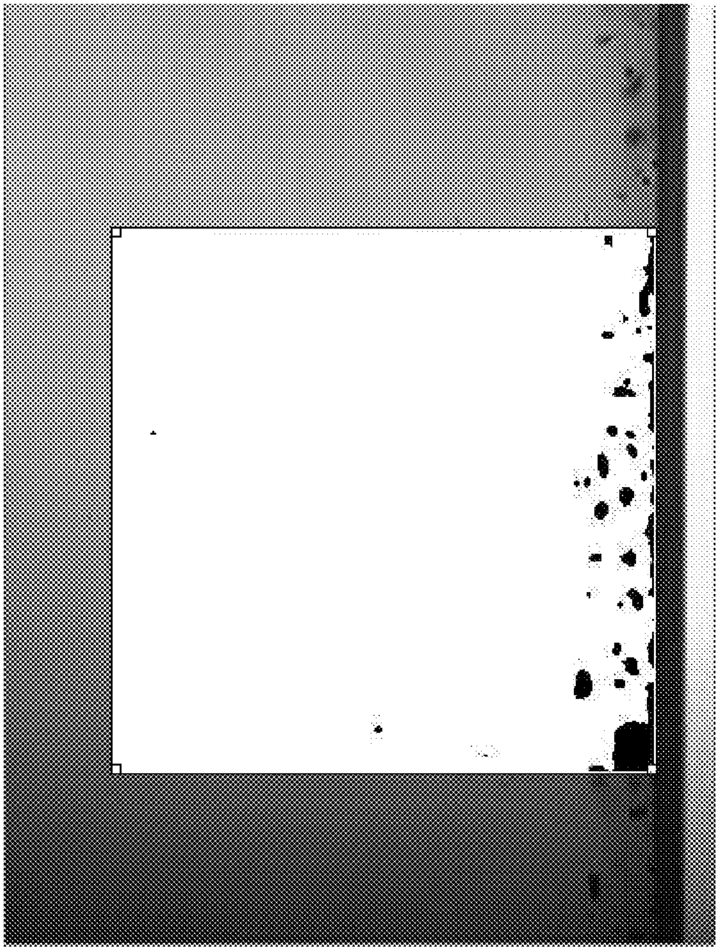
FIG. 17 is an image obtained by binarization of the microscopic photograph obtained in the example 1.

The cross section of the thus grown crystal was observed and the results were shown in FIG. 6. FIG. 17 shows binarized image thereof. As can be seen form the figures, it was proved that inclusions each having a size of several microns in a region distant from the interface by 30 μm or smaller were present in the initial stage of growth. The inclusions were subjected to SIMS analysis to detect sodium and gallium. Further, the ratio of the area of the inclusions in each layer was shown in table 1. Besides, the ratio of the area of the inclusions in the region distant from the interface by 50 μm or smaller was proved to be about 4 percent, and the ratio of the area of the inclusions in the inclusion depleted layer distant from the interface by more than 50 μm was proved to be about 0 percent.

The thus grown region was polished to a thickness of 70 μm and the total thickness of the substrate was adjusted to 0.4 mm. The defect density at the surface was evaluated by CL (Cathode Luminescence) to prove to be the order of $10^5$ to $10^6/cm^2$, which was considerably lowered than the defect density of the seed crystal substrate.

Then, the film of the nitride of the group 13 element was peeled off from the substrate by irradiating laser light from the side of the back face of the seed crystal substrate. Specifically, as the laser light source, it was used the third harmonic wave of Nd:YAG laser and having a wavelength of 355 nm. The pulse width was about 30 ns and the pulse width was about 50 kHz. The laser light 10 was condensed to a circular beam having a size of about 20 μm and to obtain an optical density of about 1.0 $J/cm^2$. Sapphire is transparent with respect to the laser light.

The thus obtained layered body was positioned on an X-Y stage with the sapphire substrate oriented upwardly. While the X-Y stage was moved at a speed of 30 mm/second, the laser light was continuously irradiated from the side of the sapphire substrate to melt the seed crystal film and the layered body was heated at 50° C. to remove the sapphire substrate. Cracks were not observed in the film of the nitride of the group 13 element.

Inventive Example 2

The gallium nitride film was formed according to the same procedure as the Inventive Example 1. However, the rotational direction was periodically inverted. Further, the acceleration time period was 1 second, retention time period was 15 seconds, deceleration time period was 1 second, and stopping time period was 15 seconds, and the inversion of the rotational direction was repeated.

Figure 18:
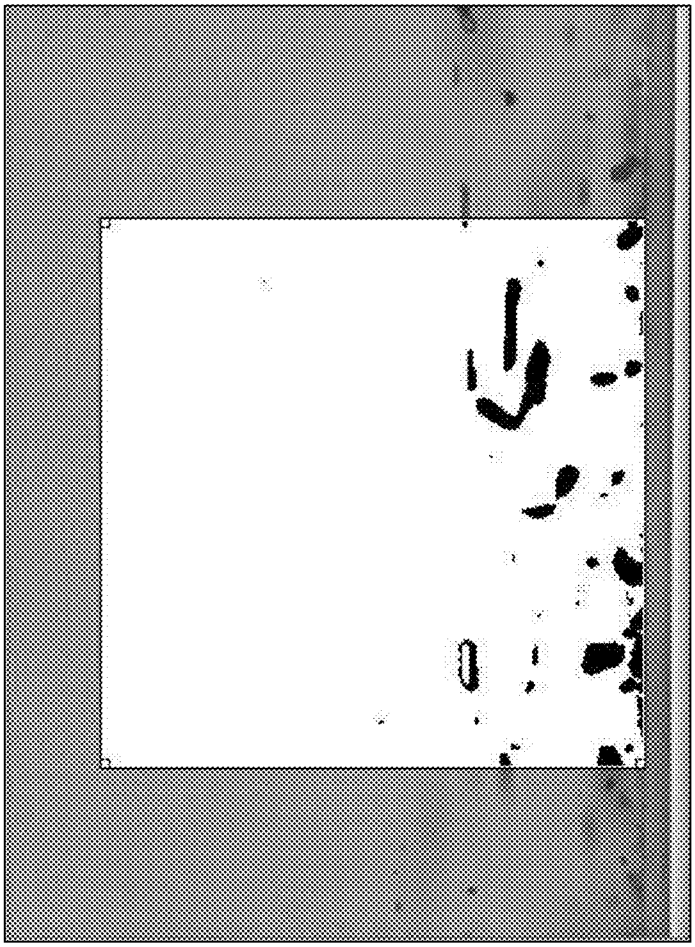
FIG. 18 is an image obtained by binarization of the microscopic photograph obtained in the example 2.

The cross section of the thus grown crystal was observed and the results were shown in FIG. 7. FIG. 18 shows the binarized image thereof. As can be seen form the figures, it was proved that inclusions each having a size of several microns were present in a region distant from the interface by 50 μm or smaller in the initial stage of growth. The inclusions were subjected to SIMS analysis to detect sodium and gallium. The ratio of the area of the inclusions in each layer was shown in table 1. Besides, the ratio of the area of the inclusions in the region distant from the interface by 50 μm or smaller was proved to be about 8 percent, and the ratio of the area of the inclusions in the inclusion depleted layer distant from the interface by more than 50 μm was proved to be about 0 percent.

The thus grown region was polished to a thickness of 70 μm and the total thickness of the substrate was adjusted to 0.4 mm. The defect density at the surface was evaluated by CL (Cathode Luminescence) to prove to be the order of $10^5$ to $10^6$/$cm^2$, which was considerably lowered than the defect density of the seed crystal substrate.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Inventive Example 3

The gallium nitride film was formed according to the same procedure as the Inventive Example 1. However, the rotational direction was periodically inverted. Further, the acceleration time period was 1 second, retention time period was 15 seconds, deceleration time period was 1 second, and stopping time period was 15 seconds, and the inversion of the rotational direction was repeated. The rotation speed was made 10 rpm.

Figure 19:
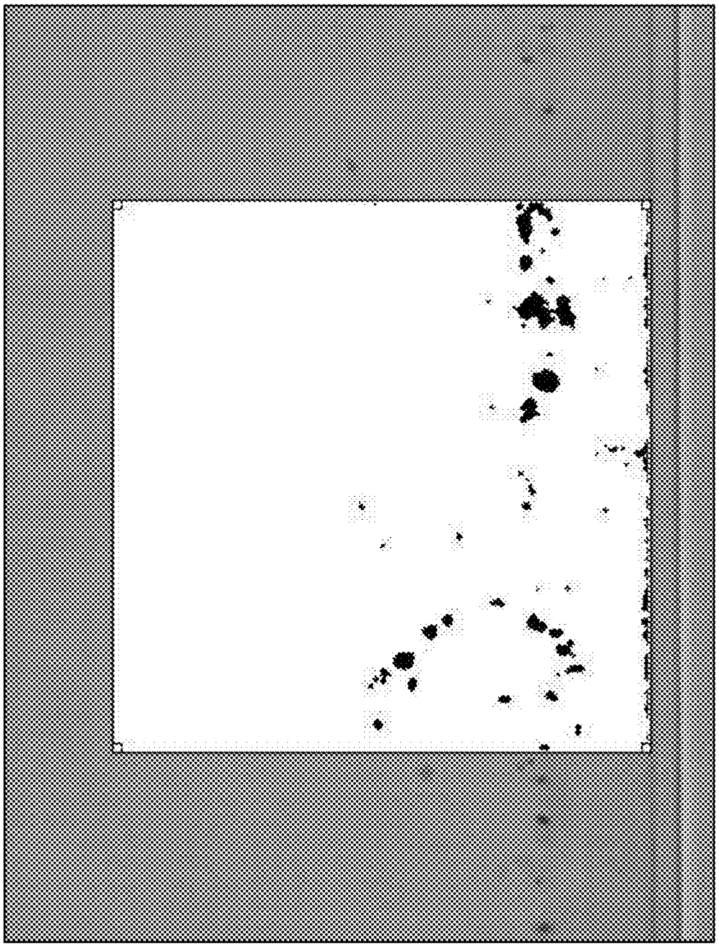
FIG. 19 is an image obtained by binarization of the microscopic photograph obtained in the example 3.

The cross section of the thus grown crystal was observed and the results were shown in FIG. 8. FIG. 19 shows the binarized image thereof. As can be seen form the figures, it was proved that inclusions each having a size of several microns were present in a region distant from the interface by 50 μm or smaller in the initial stage of growth. The inclusions were subjected to SIMS analysis to detect sodium and gallium. The ratio of the inclusions in each layer was shown in table 1. Besides, the ratio of the area of the inclusions in the region distant from the interface by 50 μm or smaller was proved to be about 2 percent, and the ratio of the area of the inclusions in the inclusion depleted layer distant from the interface by more than 50 μm was proved to be about 0 percent.

The thus grown region was polished to a thickness of 70 μm and the total thickness of the substrate was adjusted to 0.4 mm. The defect density of the surface was evaluated by CL (Cathode Luminescence) to prove to be the order of $10^5$ to $10^6$/$cm^2$, which was considerably lowered than the defect density of the seed crystal substrate.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Inventive Example 4

The gallium nitride film was formed according to the same procedure as the Example 1. However, the rotational direction was clockwise only and the rotational speed was made 30 rpm. Further, the amounts of sodium metal, gallium metal and carbon were made 13.5 g, 18 g and 35 mg, respectively, and Ga/Na ratio was made 30 mol %.

Figure 9:
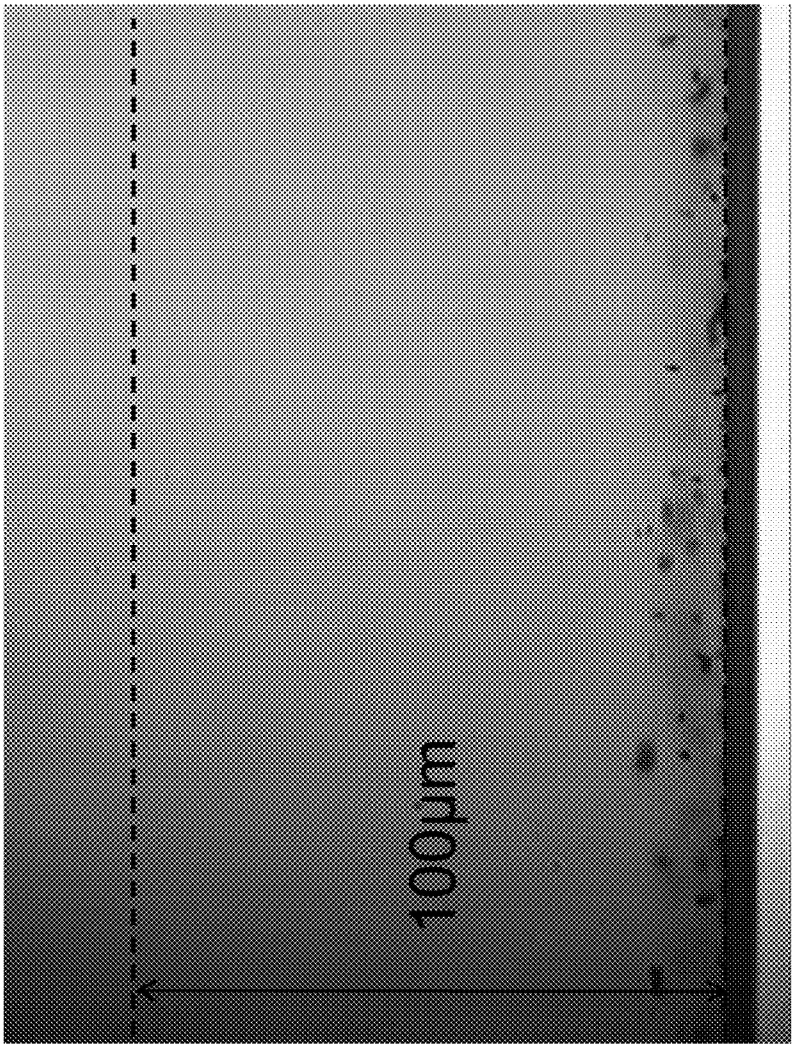
FIG. 9 is a microscopic photograph of a nitride single crystal obtained in example 1.
Figure 20:
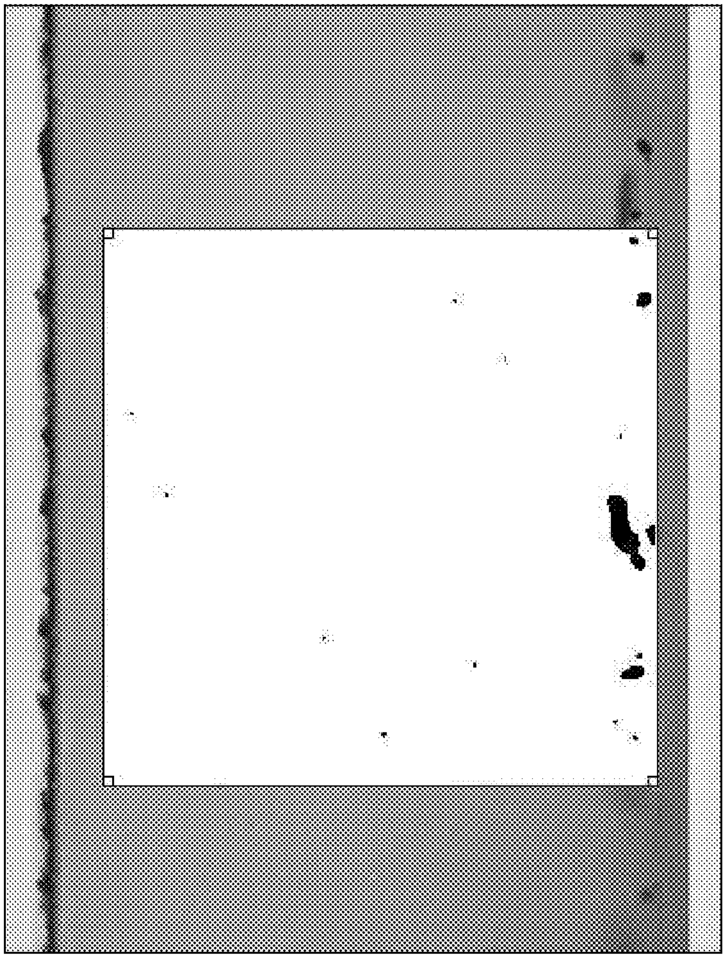
FIG. 20 is an image obtained by binarization of the microscopic photograph obtained in the example 4.

The cross section of the thus grown crystal was observed and the results were shown in FIG. 9. FIG. 20 shows the binarized image thereof. As can be seen form the figures, it was proved that inclusions each having a size of several microns were present in a region distant from the interface by 20 μm or smaller in the initial stage of growth. The inclusions were subjected to SIMS analysis to detect sodium and gallium. The ratio of the inclusions in each layer was shown in table 1. Besides, the ratio of the area of the inclusions in the region distant from the interface by 50 μm or smaller was proved to be about 7 percent, and the ratio of the area of the inclusions in the inclusion depleted layer distant from the interface by more than 50 μm was proved to be about 0 percent.

The thus grown region was polished to a thickness of 70 μm and the total thickness of the substrate was adjusted to 0.4 mm. The defect density of the surface was evaluated by CL (Cathode Luminescence) to prove to be the order of $10^5$ to $10^6$/$cm^2$, which was considerably lowered than the defect density of the seed crystal substrate.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Inventive Example 5

The gallium nitride film was formed according to the same procedure as the Inventive Example 1. However, the amounts of sodium metal, gallium metal and carbon were made 13.5 g, 18 g and 35 mg, respectively, and Ga/Na ratio was made 30 mol %.

Figure 10:
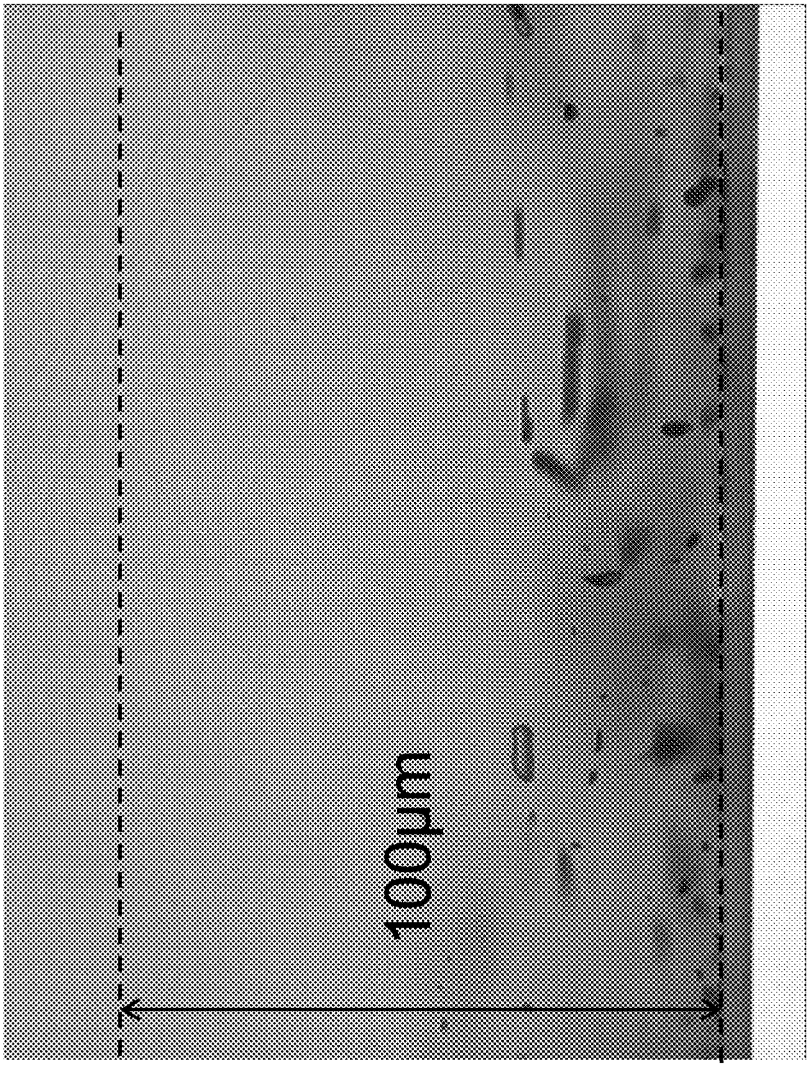
FIG. 10 is a microscopic photograph of a nitride single crystal obtained in example 2.
Figure 21:
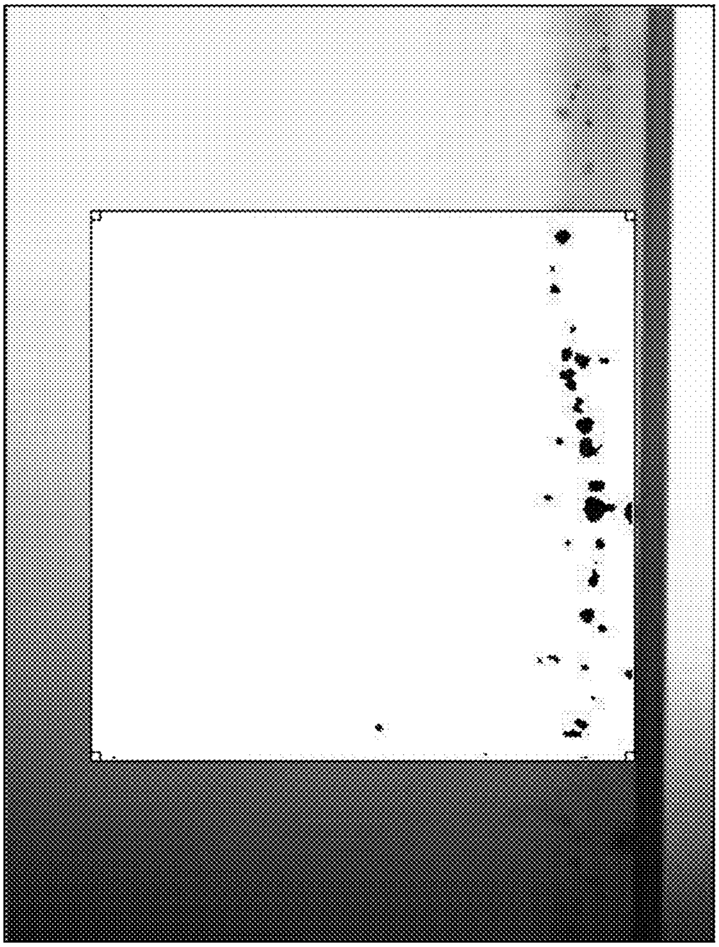
FIG. 21 is an image obtained by binarization of the microscopic photograph obtained in the example 5.

The cross section of the thus grown crystal was observed and the results were shown in FIG. 10. FIG. 21 shows the binarized image thereof. As can be seen form the figures, it was proved that inclusions each having a size of several microns were present in a region distant from the interface by 50 μm or smaller in the initial stage of growth. The inclusions were subjected to SIMS analysis to detect sodium and gallium. The ratio of the inclusions in each layer was shown in table 1. Besides, the ratio of the area of the inclusions in the region distant from the interface by 25 μm or smaller was proved to be about 8 percent, and the ratio of the area of the inclusions in the upper inclusion depleted layer more distant from the interface was proved to be about 0 percent.

The thus grown region was polished to a thickness of 70 μm and the total thickness of the substrate was adjusted to 0.4 mm. The defect density at the surface was evaluated by CL (Cathode Luminescence) to prove to be the order of $10^5$ to $10^6$/$cm^2$, which was considerably lowered than the defect density of the seed crystal substrate.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Comparative Example 1

The gallium nitride film was formed according to the same procedure as the Inventive Example 1. However, the amounts of sodium metal, gallium metal and carbon were made 10 g, 5 g and 39 mg, respectively, and Ga/Na ratio was made 10 mol %. Further, the rotation was not stopped and the container was continuously rotated for 15 hours clockwise at a speed of 30 rpm to grow the crystal. The thus obtained gallium nitride crystal plate had a size of ϕ2 inches and grown on the seed crystal substrate by about 0.1 mm. The average crystal growth rate can thus be estimated as about 6.7 μm/hr.

Figure 11:
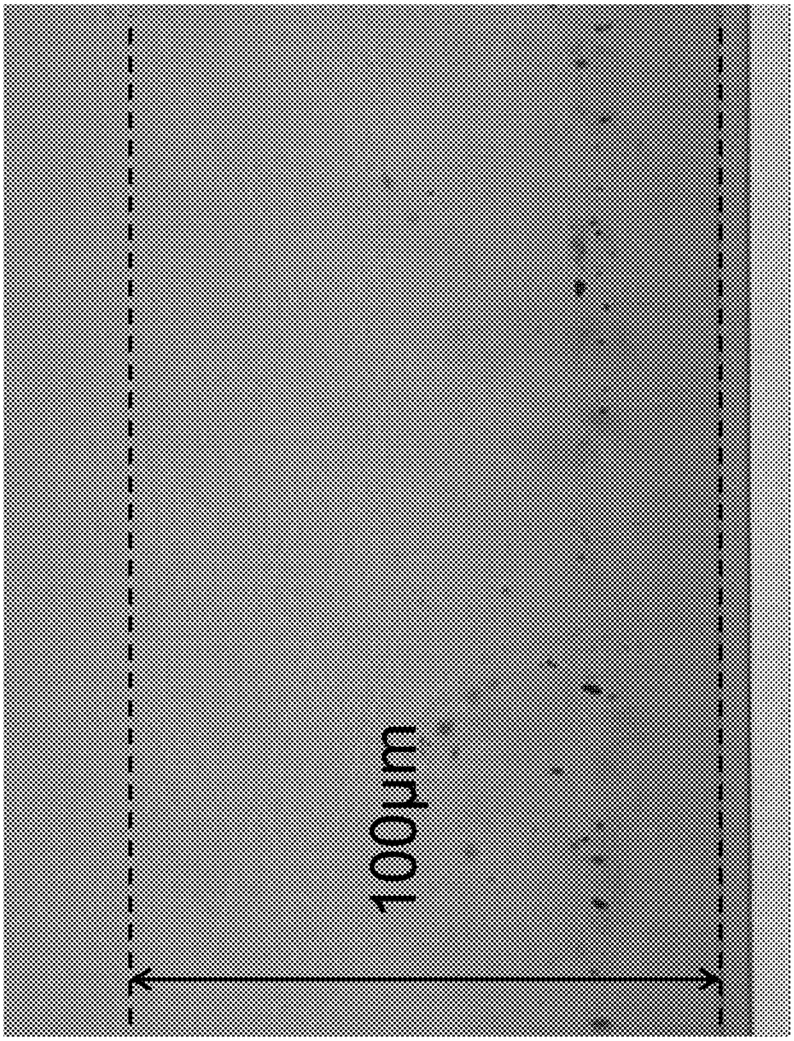
FIG. 11 is a microscopic photograph of a nitride single crystal obtained in example 3.
Figure 22:
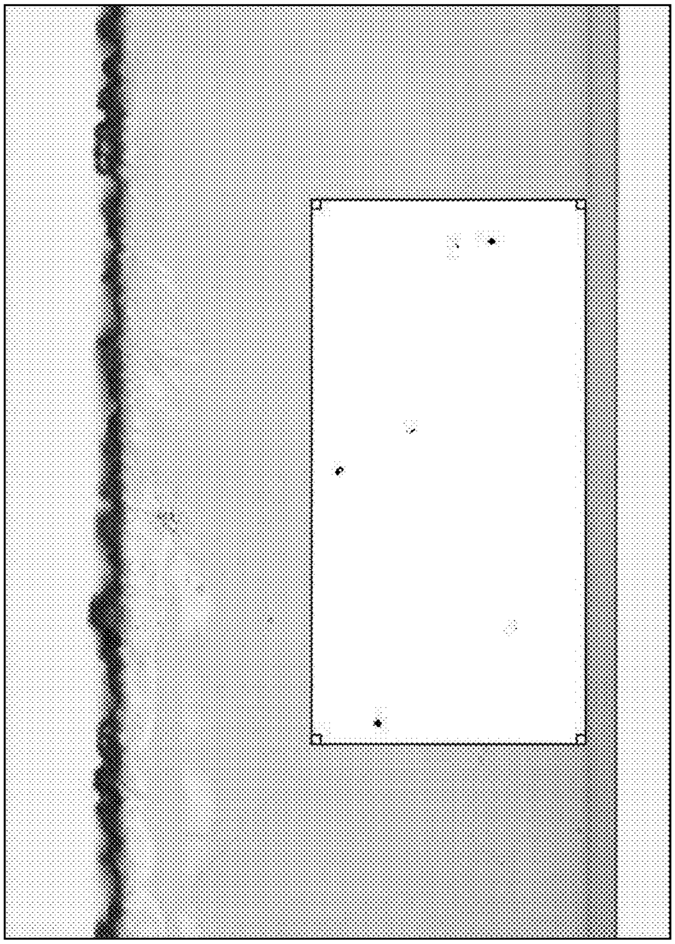
FIG. 22 is an image obtained by binarization of the microscopic photograph obtained in the comparative example 1.

The cross section of the thus grown crystal was observed and the results were shown in FIG. 11. FIG. 22 shows the binarized image thereof. As can be seen form the figures, it was proved that inclusions were not observed in a region distant from the interface by 50 μm or smaller in the initial stage of growth.

The thus grown region was polished to a thickness of 70 μm and the total thickness of the substrate was adjusted to 0.4 mm. The defect density at the surface was evaluated by CL (Cathode Luminescence) to prove to be the order of $10^7$/cm$^2$. Although it was considerably lowered than the defect density of the seed crystal substrate, the defect density was higher than that in the Inventive Example 1.

Then, as the Inventive Example 1, the laser light was irradiated from the side of the back face of the seed crystal substrate so that the film of the nitride of the group 13 element was peeled off from the substrate. As a result, although the sapphire substrate was peeled off, cracks were observed in the film of the nitride of the group 13 element.

Comparative Example 2

The gallium nitride film was formed according to the same procedure as the Inventive Example 1. However, the rotation was not stopped and the container was continuously rotated for 15 hours clockwise at a speed of 30 rpm to grow the crystal. The thus obtained gallium nitride crystal plate had a size of ϕ2 inches and grown on the seed crystal substrate by about 0.1 mm.

Figure 12:
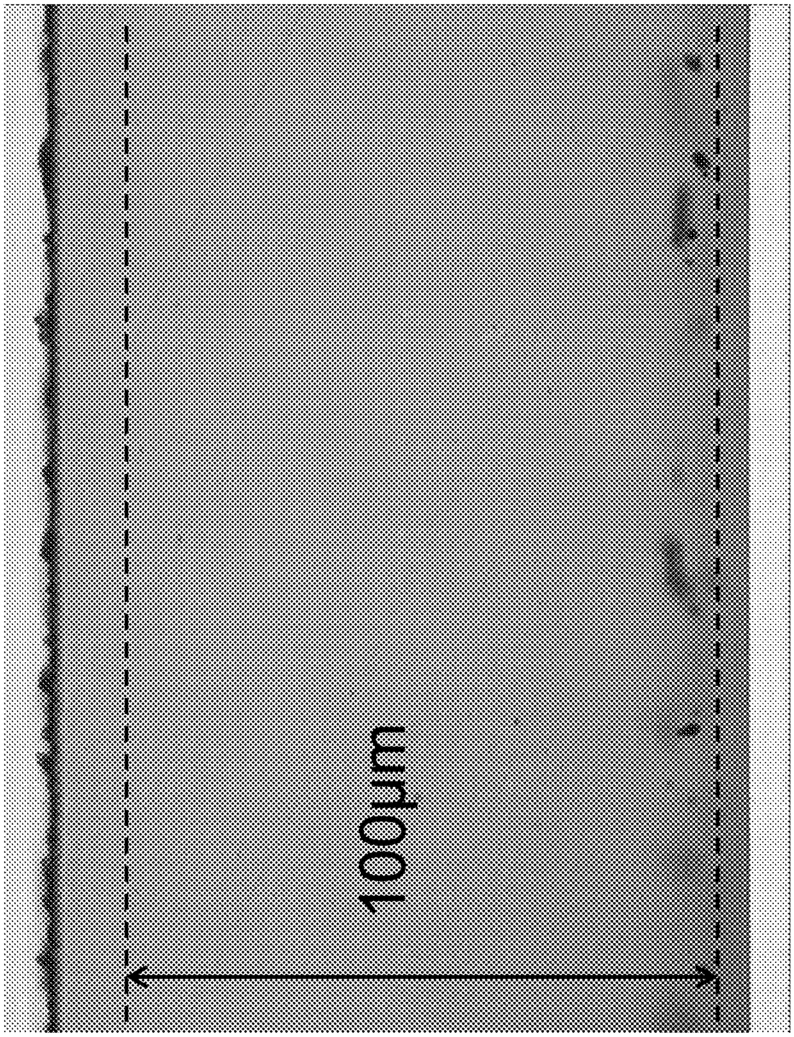
FIG. 12 is a microscopic photograph of a nitride single crystal obtained in example 4.
Figure 23:
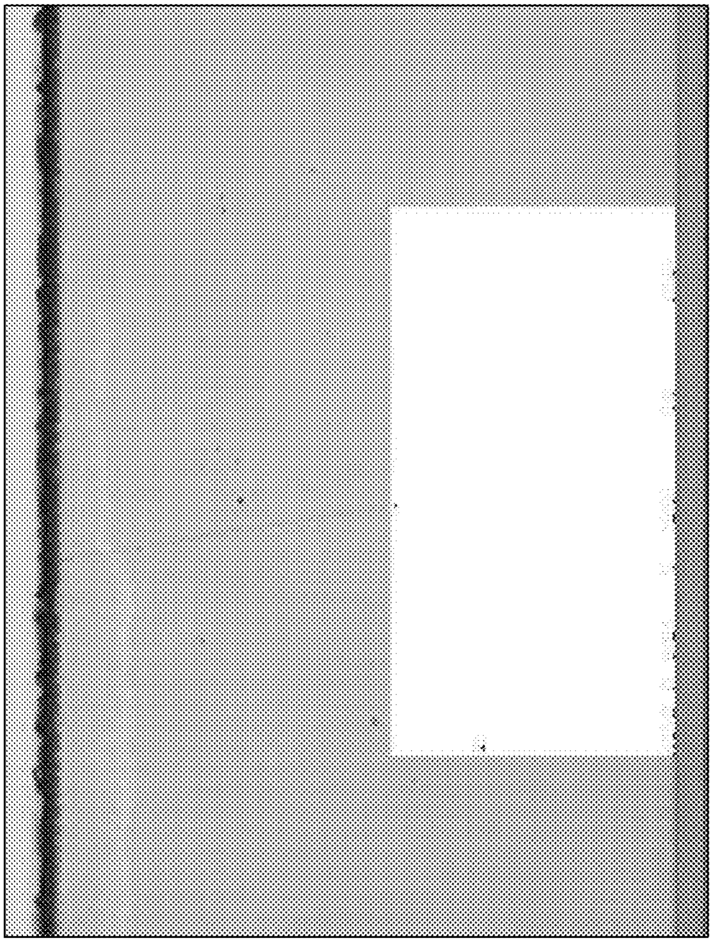
FIG. 23 is an image obtained by binarization of the microscopic photograph obtained in the comparative example 2.

The cross section of the thus grown crystal was observed and the results were shown in FIG. 12. FIG. 23 shows the binarized image thereof. As can be seen form the figures, it was proved that inclusions were not observed in a region distant from the interface by 50 μm or smaller in the initial stage of growth.

The thus grown region was polished to a thickness of 70 μm and the total thickness of the substrate was adjusted to 0.4 mm. The defect density at the surface was evaluated by CL (Cathode Luminescence) to prove to be the order of $10^7$/cm$^2$. Although it was considerably lowered than the defect density of the seed crystal substrate, the defect density was higher than that in the Inventive Example 1.

Then, as the Inventive Example 1, the laser light was irradiated from the side of the back face of the seed crystal substrate so that the film of the nitride of the group 13 element was peeled off from the substrate. As a result, although the sapphire substrate was peeled off, cracks were observed in the film of the nitride of the group 13 element.

Comparative Example 3

The gallium nitride film was formed according to the same procedure as the Inventive Example 1. However, the amounts of sodium metal, gallium metal and carbon were made 13.5 g, 18 g and 35 mg, respectively, and Ga/Na ratio was made 30 mol %. Further, the rotational direction was periodically inverted and the rotational speed was made 10 rpm. The thus obtained gallium nitride crystal plate had a size of ϕ2 inches and grown on the seed crystal substrate by about 0.1 mm.

Figure 13:
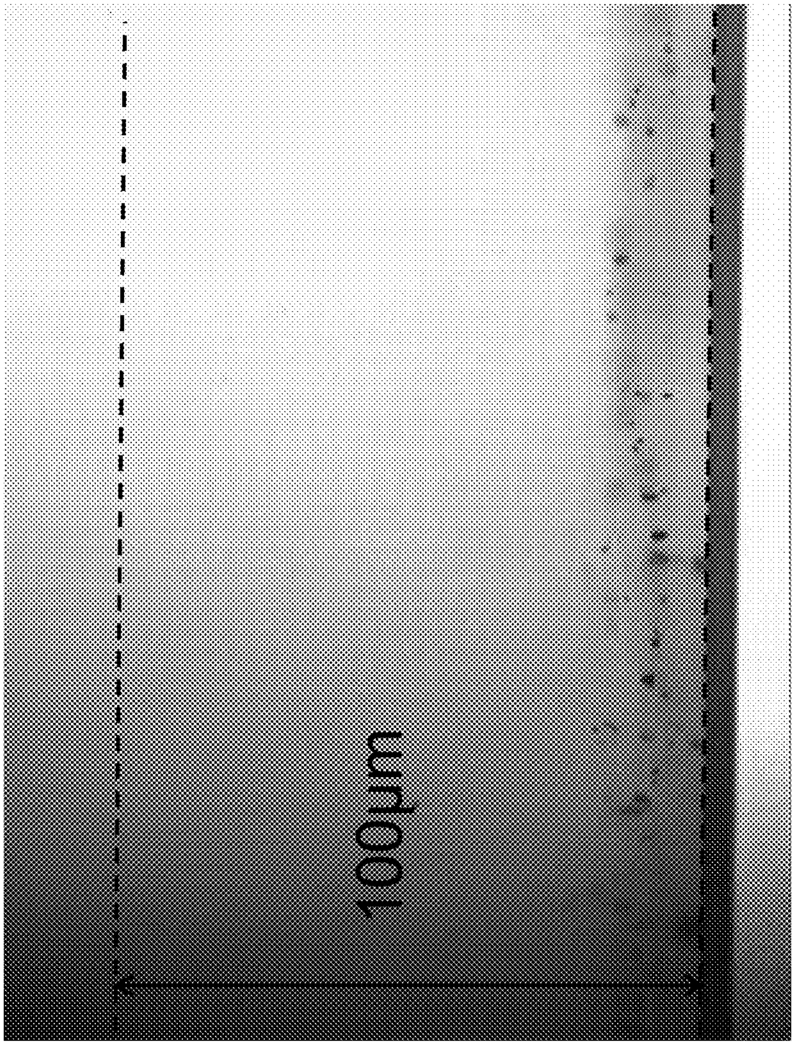
FIG. 13 is a microscopic photograph of a nitride single crystal obtained in example 5.
Figure 14:
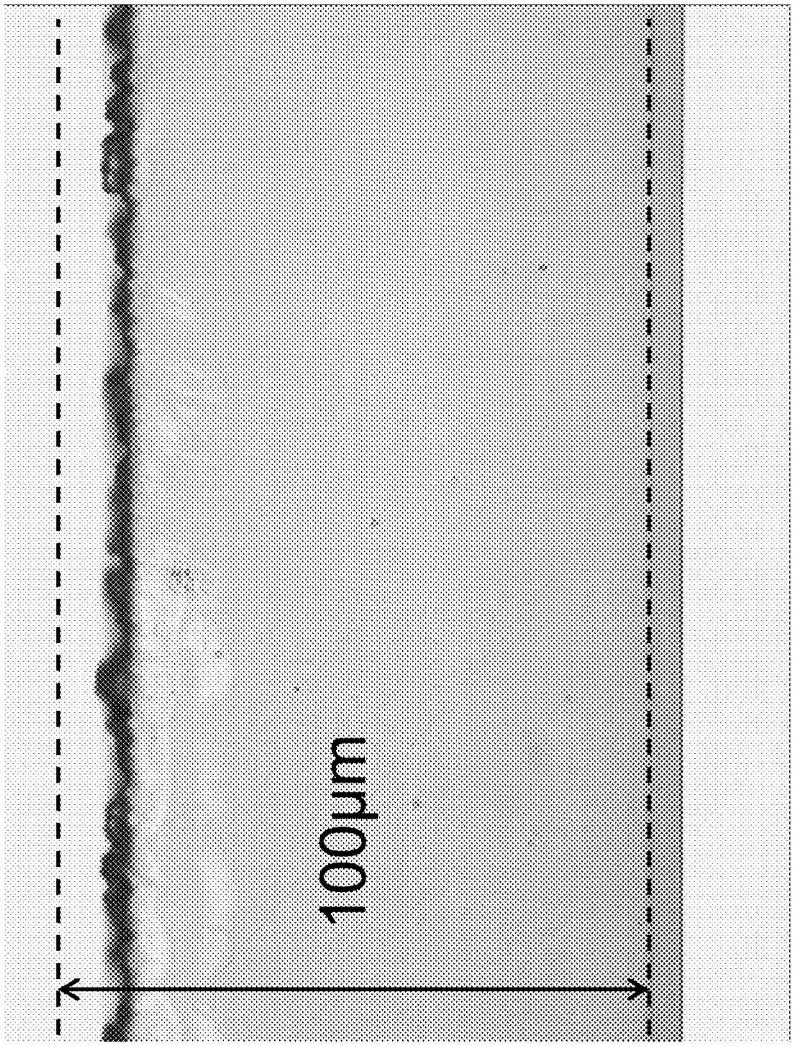
FIG. 14 is a microscopic photograph of a nitride single crystal obtained in comparative example 1.
Figure 15:
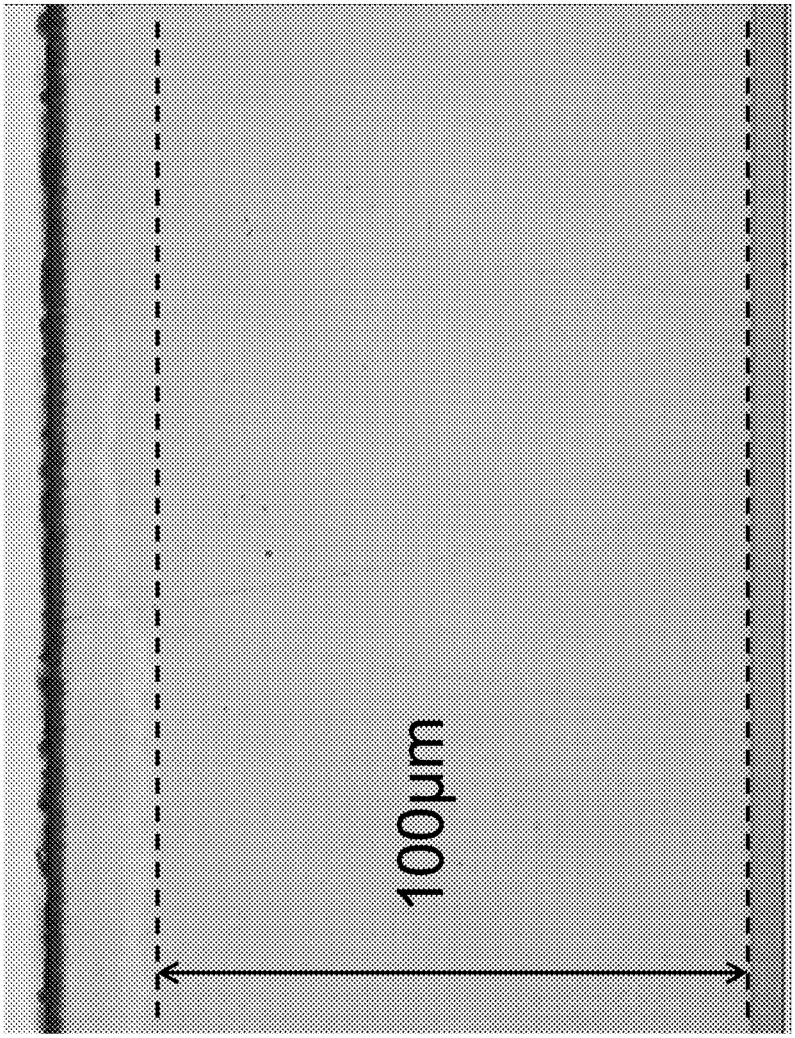
FIG. 15 is a microscopic photograph of a nitride single crystal obtained in comparative example 2.
Figure 16:
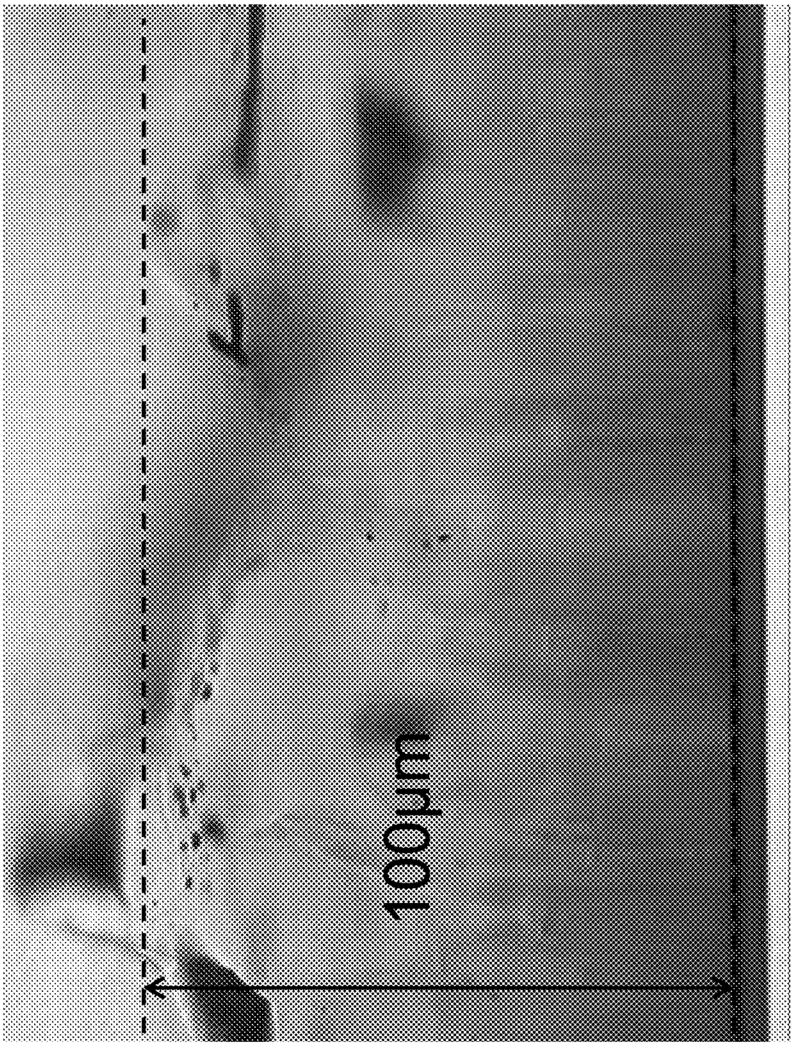
FIG. 16 is a microscopic photograph of a nitride single crystal obtained in comparative example 3.
Figure 24:
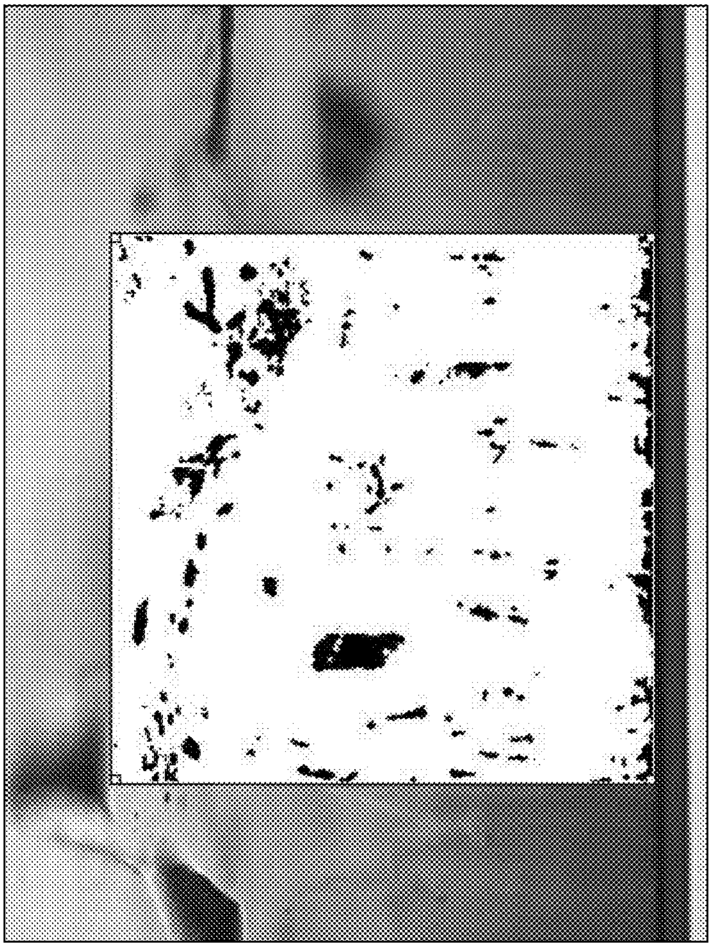
FIG. 24 is an image obtained by binarization of the microscopic photograph obtained in the comparative example 3.

The cross section of the thus grown crystal was observed and the results were shown in FIG. 13. FIG. 24 shows the binarized image thereof. As can be seen form the figures, it was proved that large inclusions were present in a region distant from the interface by 50 μm or smaller in the initial stage of growth. The inclusions were subjected to SIMS analysis to detect sodium and gallium. Further, the ratio of the area of the inclusions in the region distant from the interface by 50 μm or smaller was proved to be about 20 percent, and the ratio of the area of the inclusions in the upper layer more distant from the interface was proved to be about 20 percent.

The thus grown region was polished to a thickness of 70 μm and the total thickness of the substrate was adjusted to 0.4 mm. The defect density at the surface was evaluated by CL (Cathode Luminescence) to prove to be the order of $10^7$/cm$^2$.

Then, as the Inventive Example 1, the laser light was irradiated from the side of the back face of the seed crystal substrate so that the film of the nitride of the group 13 element was peeled off from the substrate. As a result, although the sapphire substrate was peeled off and cracks were observed in the film of the nitride of the group 13 element.

Inventive Example 6

The film of the nitride of the group 13 element was formed on the seed crystal substrate 11 as described in the inventive example 1. Then, on the thus obtained film of the nitride of the group 13 element, n-type semiconductor layer, light emitting region and p-type semiconductor region are formed by MOCVD, respectively. Further, the n-type and p-type electrodes are formed on predetermined positions to produce a blue ray LED having a wavelength of about 460 nm.

4 μm of n-type GaN doped with Si and 5000 angstroms of InGaN doped with Si are laminated, and as the active layer of a multi quantum well functioning as the light emitting region, six well layers and seven barrier layers are alternately laminated in which the well layer is undoped InGaN and barrier layer is Si doped GaN with the thicknesses of 70 angstroms and 300 angstroms, respectively. The composition of In of the InGaN well layer was about 15 mol percent. In this case, the barrier layer laminated at last may be undoped GaN. After the active layer of the multi well structure is laminated, as the p-type semiconductor layer, 200 angstroms of Mg-doped AlGaN, 1000 angstroms of undoped GaN and 200 angstroms of Mg-doped GaN are laminated. The undoped GaN layer formed as the p-type semiconductor layer exhibits p-type due to the diffusion of Mg from the adjoining layers.

Then, for forming the n-type electrode, the Mg-doped GaN, p-type semiconductor layer, active layer and a part of the n-type semiconductor layer are etched to expose the Si-doped GaN layer. Then, a translucent p-type electrode made of Ni/Au is formed over the whole surface of the p-type semiconductor layer. Further, on the translucent p-type electrode, a p-type pad electrode of Au is formed on the position opposing the exposed face of the n-type semiconductor layer, and an n-type electrode made of W/Al/W and an n-type pad electrode of Pt/Au are formed on the exposed surface of the n-type semiconductor layer.

Then, as the inventive example 1, the laser light was irradiated from the side of the back face of the seed crystal substrate so that the film of the nitride of the group 13 element and the light emitting structure 31 thereon were peeled off from the substrate. As a result, the sapphire substrate was peeled and cracks were not observed in the film of the nitride of the group 13 element.

Then, the internal quantum efficiency of the thus obtained light emitting device was calculated according to Shockley-Read-Hall method to obtain a high value of about 90 percent. In the case that the same LED was formed on the sapphire substrate, the inner quantum efficiency was about 60 percent.

TABLE 1

Relationship between grown thickness and ratio of area of inclusions

| Grown thickness μm | Inv. Ex. 1 | Inv. Ex. 2 | Inv. Ex. 3 | Inv. Ex. 4 | Inv. Ex. 5 | Com. Ex. 1 | Com. Ex. 2 | Com. Ex. 3 |
|---|---|---|---|---|---|---|---|---|
| 0~10 | 17 | 18 | 10 | 7 | 6 | 0 | 0 | 23 |
| 10~20 | 2 | 7 | 7 | 0 | 7 | 0 | 0 | 2 |

TABLE 1-continued

| Relationship between grown thickness and ratio of area of inclusions | | | | | | | | |
|---|---|---|---|---|---|---|---|---|
| Grown thickness μm | Inv. Ex. 1 | Inv. Ex. 2 | Inv. Ex. 3 | Inv. Ex. 4 | Inv. Ex. 5 | Com. Ex. 1 | Com. Ex. 2 | Com. Ex. 3 |
| 20~30 | 0 | 10 | 7 | 0 | 0 | 0 | 0 | 5 |
| 30~40 | 0 | 3 | 2 | 0 | 0 | 0 | 0 | 6 |
| 40~50 | 0 | 0 | 2 | 0 | 0 | 0 | 0 | 2 |
| 50~60 | 0 | 0 | 0 | 0 | 0 | 0 | 0 | 8 |
| 60~70 | 0 | 0 | 0 | 0 | 0 | 0 | 0 | 8 |
| 70~80 | 0 | 0 | 0 | 0 | 0 | 0 | 0 | 6 |
| 80~90 | 0 | 0 | 0 | 0 | 0 | — | 0 | 6 |
| 90~100 | 0 | 0 | 0 | 0 | 0 | — | 0 | 6 |
| 100~ | 0 | 0 | 0 | 0 | 0 | — | 0 | 5 |

TABLE 2

| Maximum area of inclusions | | | | | |
|---|---|---|---|---|---|
| | Inv. Ex. 1 | Inv. Ex. 2 | Inv. Ex. 3 | Inv. Ex. 4 | Inv. Ex. 5 |
| Maximum inclusion size ($\mu m^2$) | 30 | 60 | 20 | 60 | 20 |

| | Com. Ex. 1 | Com. Ex. 2 | Com. Ex. 3 |
|---|---|---|---|
| Maximum inclusion size ($\mu m^2$) | 5 | 1 | 150 |

Next, they were variously changed the ratio of the thickness of the inclusion distributed layer and that of the inclusion depleted layer to study its relationship with the warping of the film.

Besides, a laser interferometer was used to measure distribution of heights with respect to the back face of the film, and a difference of the heights of the highest point and lowest point is defined as "warping". Positive warping corresponds to the shape that the surface is protruded and negative warping corresponds to the shape that the surface is recessed. The film surface was protruded in the following inventive and comparative examples.

Inventive Example 7

The gallium nitride film was formed according to the same procedure as the Inventive Example 1. However, the holding time period for the growth was 12 hours. The thus obtained gallium nitride crystal had a size of ϕ2 inches and grown on the seed crystal substrate by about 0.125 mm.

Cross section of the thus grown crystal was observed to prove that there was the inclusion distributed layer in a region distant from the interface by 25 μm or smaller in the initial stage of the growth. Therefore, the thickness of the inclusion depleted layer is 4, provided that 1 is assigned to the thickness of the inclusion distributed layer. Further, the warping of the gallium nitride crystal plate was measured from the side of the sapphire substrate on the back face to prove that the warping was 130 μm.

Wax was applied onto the sapphire side, which was then adhered onto a surface plate by pressing to prove that the deviation of the thickness of the wax can be reduced to 10 μm. The grown GaN was polished to a thickness of 70 μm and the sapphire was also polished so that the total thickness of the substrate was adjusted to 0.9 mm to obtain a wafer. The warping of the wafer was proved to be 50 μm. Further, the defect density at the surface of GaN was evaluated by CL (Cathode Luminescence) to prove to be the order of $10^5$ to $10^6/cm^2$, which was considerably lower than the defect density of the seed crystal.

A blue color LED was fabricated on this wafer by MOCVD process. Specifically, after n-GaN layer having a thickness of 2 μm was formed, it was produced 7 periods of quantum well structures each having InGaN layer with a thickness of 3 nm and GaN layer with a thickness of 5 nm. p-GaN layer with a thickness of 50 nm was then formed thereon. The p-GaN side of the wafer was adhered onto a conductive silicon wafer with a thickness of 0.3 mm by metal bonding. A commercial laser lift-off system was used to irradiate laser ray from the sapphire side to separate the sapphire substrate from the GaN. The N face of the thus separated GaN was exposed. The N face was subjected to moth eye processing for improving light extraction efficiency, n electrode was then fitted thereto, and then cut into a size of 1 mm×1 mm to produce LED chips. The LED chip was mounted on a heat sink, an phosphor was applied thereon and the chip was then driven at 350 mA to prove to emit light at a high efficiency of 100 lumen/W or higher.

Inventive Example 8

The gallium nitride film was formed according to the same procedure as the Inventive Example 1. However, the upper heater, medium heater, lower heater and bottom heater were adjusted at temperatures of 880° C., 880° C., 890° C. and 890° C., respectively, so that the temperature in the heating space reached 885° C. The container was held for 4 hours under these conditions. The gallium nitride had a size of ϕ2 inches and grown on the seed crystal substrate by a thickness of about 0.025 mm.

As a result of observing the cross section of the thus grown crystal, it was proved that the inclusion distributed layer was formed in a region distant from the interface by 3 μm or smaller in the initial stage of growth. Therefore, the thickness of the inclusion depleted layer is 22/3 provided that the thickness of the inclusion distributed layer is assigned to 1.

Further, the warping of the gallium nitride crystal plate was measured from the side of the sapphire substrate on the back face to prove that the warping was 38 μm.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Inventive Example 9

The gallium nitride film was formed according to the same procedure as the Inventive Example 8. However, the container was held for 10 hours. The gallium nitride had a size of ϕ2 inches and grown on the seed crystal substrate by a thickness of about 0.105 mm.

As a result of observing the cross section of the thus grown crystal, it was proved that the inclusion distributed layer was formed in a region distant from the interface by 5 μm or smaller in the initial stage of growth. Therefore, the thickness of the inclusion depleted layer is 20, provided that the thickness of the inclusion distributed layer is assigned to 1.

Further, the warping of the gallium nitride crystal plate was measured from the side of the sapphire substrate on the back face to prove that the warping was 155 μm.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Inventive Example 10

The gallium nitride film was formed according to the same procedure as the Inventive Example 8. However, the container was held for 12 hours. The gallium nitride had a size of ϕ2 inches and grown on the seed crystal substrate by a thickness of about 0.127 mm.

As a result of observing the cross section of the thus grown crystal, it was proved that the inclusion distributed layer was formed in a region distant from the interface by 7 μm or smaller in the initial stage of growth. Therefore, the thickness of the inclusion depleted layer is 17, provided that the thickness of the inclusion distributed layer is assigned to 1.

Further, the warping of the gallium nitride crystal plate was measured from the side of the sapphire substrate on the back face to prove that the warping was 180 μm.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Inventive Example 11

The gallium nitride film was formed according to the same procedure as the Inventive Example 4. However, the container was held for 6 hours. The gallium nitride had a size of ϕ2 inches and grown on the seed crystal substrate by a thickness of about 0.030 mm.

As a result of observing the cross section of the thus grown crystal, it was proved that the inclusion distributed layer was formed in a region distant from the interface by 20 μm or smaller in the initial stage of growth. Therefore, the thickness of the inclusion depleted layer is 0.5, provided that the thickness of the inclusion distributed layer is assigned to 1.

Further, the warping of the gallium nitride crystal plate was measured from the side of the sapphire substrate on the back face to prove that the warping was 70 μm.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Inventive Example 12

The gallium nitride film was formed according to the same procedure as the Inventive Example 1. However, the container was held for 12 hours. The gallium nitride had a size of ϕ2 inches and grown on the seed crystal substrate by a thickness of about 0.110 mm.

As a result of observing the cross section of the thus grown crystal, it was proved that the inclusion distributed layer was formed in a region distant from the interface by 30 μm or smaller in the initial stage of growth. Therefore, the thickness of the inclusion depleted layer is 8/3, provided when that of the thickness of the inclusion distributed layer is assigned to 1.

Further, the warping of the gallium nitride crystal plate was measured from the side of the sapphire substrate on the back face to prove that the warping was 130 μm.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Inventive Example 13

The gallium nitride film was formed according to the same procedure as the Inventive Example 1. However, the container was held for 20 hours. The gallium nitride had a size of ϕ2 inches and grown on the seed crystal substrate by a thickness of about 0.220 mm.

As a result of observing the cross section of the thus grown crystal, it was proved that the inclusion distributed layer was formed in a region distant from the interface by 20 μm or smaller in the initial stage of growth. Therefore, the thickness of the inclusion depleted layer is 10, provided when that of the thickness of the inclusion distributed layer is assigned to 1.

Further, the warping of the gallium nitride crystal plate was measured from the side of the sapphire substrate on the back face to prove that the warping was 320 μm.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Inventive Example 14

The gallium nitride film was formed according to the same procedure as the Inventive Example 1. However, the upper heater, medium heater, lower heater and bottom heater were adjusted at temperatures of 870° C., 870° C., 880° C. and 880° C., respectively, so that the temperature in the heating space reached 875° C. The container was held for 10 hours under these conditions. The gallium nitride had a size of ϕ2 inches and grown on the seed crystal substrate by a thickness of about 0.100 mm.

As a result of observing the cross section of the thus grown crystal, it was proved that the inclusion distributed layer was formed in a region distant from the interface by 10 μm or smaller in the initial stage of growth. Therefore, the thickness of the inclusion depleted layer is 9, provided when that of the thickness of the inclusion distributed layer is assigned to 1.

Further, the warping of the gallium nitride crystal plate was measured from the side of the sapphire substrate on the back face to prove that the warping was 130 μm.

Then, as the Inventive Example 1, the laser light was irradiated from the side of the back face of the seed crystal substrate so that the film of the nitride of the group 13 element was peeled off from the substrate. As a result, the sapphire substrate was peeled off and cracks were not observed in the film of the nitride of the group 13 element.

Comparative Example 4

The gallium nitride film was formed according to the same procedure as the Comparative Example 1. However, the container was held for 15 hours. The gallium nitride had a size of ϕ2 inches and grown on the seed crystal substrate by a thickness of about 0.150 mm.

As a result of observing the cross section of the thus grown crystal, it was proved that inclusions were not observed in a region distant from the interface by 50 μm or smaller in the initial stage of growth.

Further, the warping of the gallium nitride crystal plate was measured from the side of the sapphire substrate on the back face to prove that the warping was 250 μm.

Then, as the Inventive Example 1, the laser light was irradiated from the side of the back face of the seed crystal substrate so that the film of the nitride of the group 13 element was peeled off from the substrate. As a result, although the sapphire substrate was peeled off, and cracks were observed in the film of the nitride of the group 13 element.

Comparative Example 5

The gallium nitride film was formed according to the same procedure as the Comparative Example 1. However, the container was held for 5 hours. The gallium nitride had a size of ϕ2 inches and grown on the seed crystal substrate by a thickness of about 0.050 mm.

As a result of observing the cross section of the thus grown crystal, it was proved that inclusions were not observed in a region distant from the interface by 50 μm or smaller in the initial stage of growth.

Further, the warping of the gallium nitride crystal plate was measured from the side of the sapphire substrate on the back face to prove that the warping was 85 μm.

Then, as the Inventive Example 1, the laser light was irradiated from the side of the back face of the seed crystal substrate so that the film of the nitride of the group 13 element was peeled off from the substrate. As a result, although the sapphire substrate was peeled off, cracks were observed in the film of the nitride of the group 13 element.

Comparative Example 6

The gallium nitride film was formed according to the same procedure as the Comparative Example 1. However, the container was held for 20 hours. The gallium nitride had a size of ϕ2 inches and grown on the seed crystal substrate by a thickness of about 0.200 mm.

As a result of observing the cross section of the thus grown crystal, it was proved that inclusions were not observed in a region distant from the interface by 50 μm or smaller in the initial stage of growth.

Further, the warping of the gallium nitride crystal plate was measured from the side of the sapphire substrate on the back face to prove that the warping was 340 μm.

Then, as the Inventive Example 1, the laser light was irradiated from the side of the back face of the seed crystal substrate so that the film of the nitride of the group 13 element was peeled off from the substrate. As a result, although the sapphire substrate was peeled off, cracks were observed in the film of the nitride of the group 13 element.

Comparative Example 7

The gallium nitride film was formed according to the same procedure as the Inventive Example 1. However, the upper heater, medium heater, lower heater and bottom heater were adjusted at temperatures of 850° C., 850° C., 860° C. and 860° C., respectively, so that the temperature in the heating space reached 855° C. The container was held for 10 hours under these conditions. The gallium nitride had a size of ϕ2 inches and grown on the seed crystal substrate by a thickness of about 0.100 mm.

As a result of observing the cross section of the thus grown crystal, it was proved that inclusions were distributed in a region distant from the interface by 50 μm or smaller in the initial stage of growth, as well as in a region distant from the interface by 50 to 60 μm. The ratio of the area of the inclusions in a region distant from the interface by 50 μm or smaller was proved to be about 4 percent, and the ratio of the area of the inclusions in a region distant from the interface by 50 to 60 μm was proved to be about 3 percent.

Further, the gallium nitride crystal plate was used to form an LED structure. As a result, surface roughness was introduced in the grown inclusion-containing area, so that production of the LED was failed.

(Evaluation)

Figure 25:
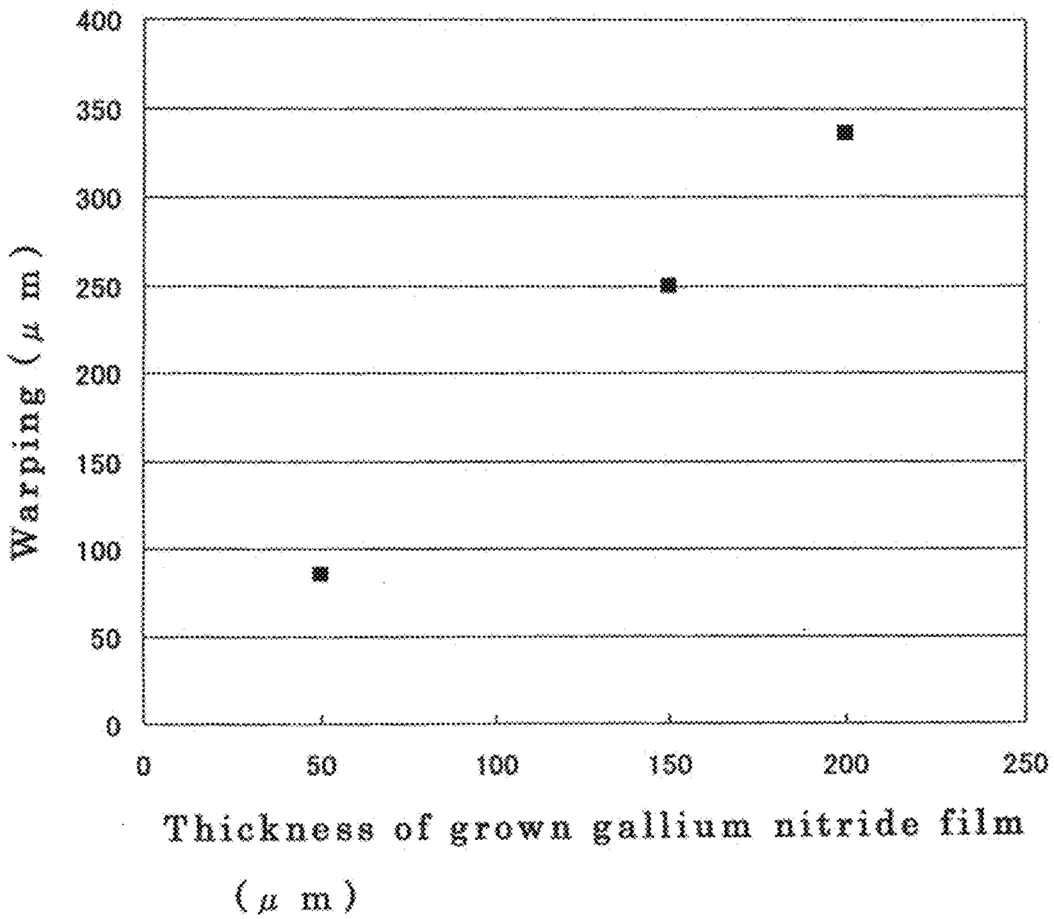
FIG. 25 is a graph showing relationship of a thickness and warping of a gallium nitride film according to a comparative example.

FIG. 25 shows a graph indicating relationship between the thickness and warping of the gallium nitride films produced in the Comparative Examples 4, 5 and 6. As can be seen from the figures, it is proved that the thickness and warping are proportional with each other in the case that the inclusion distributed layer is not present. It can be thereby speculated the value of the warping with respect to optional thickness of a gallium nitride film.

Figure 26:
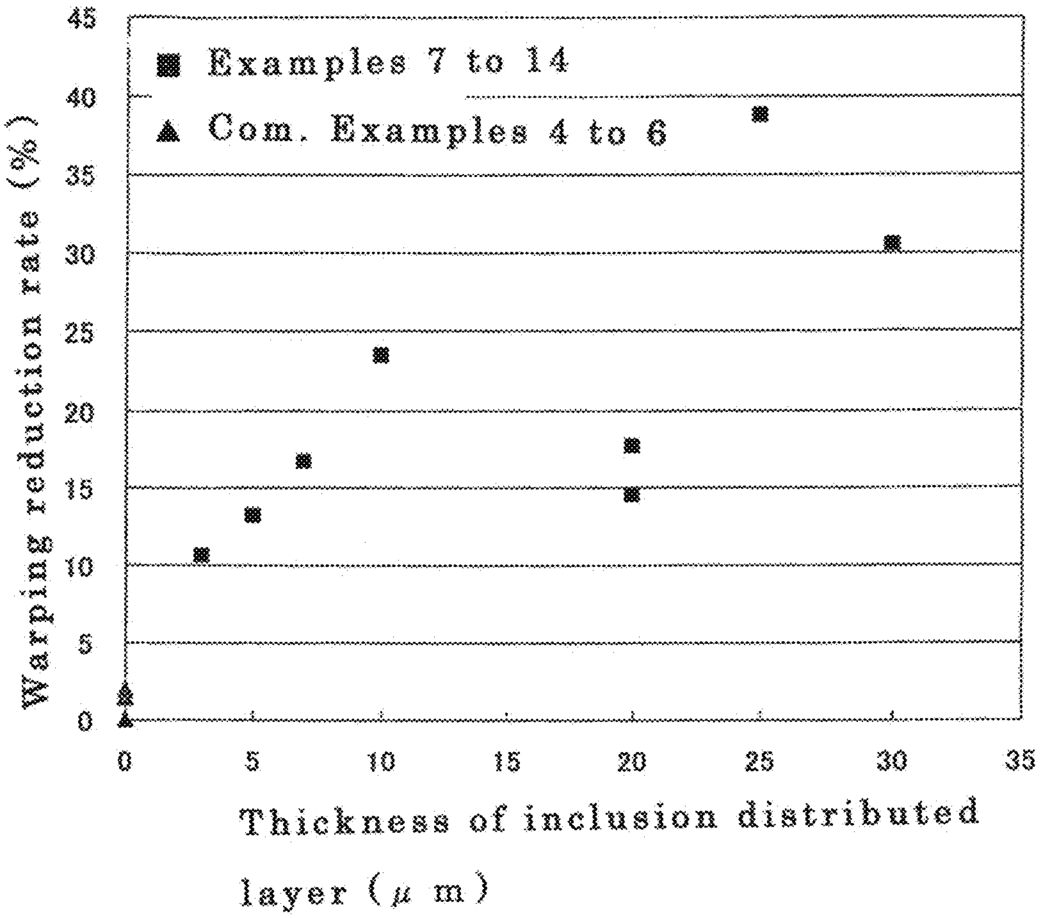
FIG. 26 is a graph showing relationship of a thickness and a reduction rate of warping of an inclusion distributed layer.

It is further calculated warping reduction rate (%), by obtaining differences between (A) values of warping of the gallium nitride films produced in the inventive examples 7 to 14 and (B) values of warping predicted in the case that the thickness is identical and the inclusion distributed layer is not present, by dividing the difference by (B) to obtain a ratio, and by then multiplying a factor of 100 to the ratio. FIG. 26 is a graph showing relationship between the thickness of the inclusion distributed layer and warping reduction rate. According to the figure, it is obtained a warping reduction rate of about 10 to 40 percent in the case that the inclusion distributed layer is present, to prove the effect of the reduction of warping.

Although specific embodiments of the present invention have been described above, the invention is not limited by these specific embodiments, and can be performed with various kinds of changes and modifications without departing from the claims.

The invention claimed is:

1. A method of peeling a film of a nitride of a group 13 element, said method comprising the step of:

irradiating a laser light to a layered body comprising a seed crystal substrate and a film of a nitride of a group 13 element grown on said seed crystal substrate by flux method from a melt comprising a flux and a group 13 element under nitrogen containing atmosphere, said laser light being irradiated from a side of a back face of said seed crystal substrate to peel said film of said nitride of said group 13 element from said seed crystal substrate, wherein said film comprises an inclusion distributed layer in a region distant by 50 μm or less from an interface of said film of said nitride of said group 13 element on a side of said seed crystal substrate and comprising inclusions derived from components of said melt, and wherein said film comprises an inclusion depleted layer with said inclusion depleted formed on said inclusion distributed layer.

2. The method of claim 1, wherein the maximum area of said inclusion in said inclusion distributed layer is 60 $\mu m^2$ or smaller, viewed in a cross section of said film of said nitride of said group 13 element.

3. The method of claim 1, wherein said nitride of said group 13 element comprises gallium nitride, aluminum nitride or aluminum gallium nitride.

4. The method of claim 3, wherein said nitride of said group 13 element comprises at least one of germanium, silicon and oxygen, and wherein said nitride is of n-type.

5. The method of claim 1, wherein a thickness of said inclusion depleted layer is 20 to 0.1 provided that a thickness of said inclusion distributed layer is 1.

6. The method of claim 1, wherein said seed crystal substrate comprises a single crystal substrate and a seed crystal film provided on said single crystal substrate, said method further comprising the step of growing said film of said nitride of said group 13 element on said seed crystal film, and wherein said laser light is irradiated from a side of said single crystal substrate to peel said film of said nitride of said group 13 element.

7. The method of claim 1, further comprising the step of removing said inclusion depleted layer after said film of said nitride of said group 13 element from said seed crystal substrate.

8. The method of claim 1, further comprising the step of forming an n-type semiconductor layer, a light emitting region and a p-type semiconductor layer on said film of said nitride of said group 13 element, wherein said film of said nitride of said group 13 element is then peeled off from said seed crystal substrate.

* * * * *